(12) United States Patent
Li et al.

(10) Patent No.: US 9,461,055 B2
(45) Date of Patent: Oct. 4, 2016

(54) ADVANCED METAL-NITRIDE-OXIDE-SILICON MULTIPLE-TIME PROGRAMMABLE MEMORY

(71) Applicant: QUALCOMM Incorporated, San Diego, CA (US)

(72) Inventors: Xia Li, San Diego, CA (US); Zhongze Wang, San Diego, CA (US); Daniel Wayne Perry, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 15 days.

(21) Appl. No.: 14/280,213

(22) Filed: May 16, 2014

(65) Prior Publication Data

US 2015/0333072 A1    Nov. 19, 2015

(51) Int. Cl.

| H01L 27/112 | (2006.01) |
|---|---|
| G11C 11/40 | (2006.01) |
| G11C 7/00 | (2006.01) |
| G11C 16/04 | (2006.01) |
| H01L 21/28 | (2006.01) |
| H01L 29/423 | (2006.01) |

(Continued)

(52) U.S. Cl.
CPC .............. *H01L 27/112* (2013.01); *G11C 7/00* (2013.01); *G11C 11/40* (2013.01); *G11C 16/0475* (2013.01); *H01L 21/28282* (2013.01); *H01L 27/11565* (2013.01); *H01L 27/11568* (2013.01); *H01L 29/42344* (2013.01); *H01L 29/42348* (2013.01); *H01L 29/66833* (2013.01); *H01L 29/7923* (2013.01)

(58) Field of Classification Search
USPC .......................................... 365/182; 257/369

IPC .................... H01L 27/112,21/28282, 27/11568, H01L 29/42348, 29/66833, 29/7923, 27/11565, H01L 29/42344; G11C 11/40, 7/00, 16/0475
See application file for complete search history.

(56) References Cited

U.S. PATENT DOCUMENTS

| 7,635,893 B2 | 12/2009 | Weis et al. |
|---|---|---|
| 8,026,553 B2 | 9/2011 | Shino |

(Continued)

FOREIGN PATENT DOCUMENTS

JP    2014049460 A    3/2014

OTHER PUBLICATIONS

Ishida, T., et al., "Characterization of Charge Traps in Metal-Oxide-Nitride-Oxide-Semiconductor (MONOS) Structures for Embedded Flash Memories," 44th Annual International Reliability Physics Symposium, 2006, pp. 516-522.

(Continued)

*Primary Examiner* — Hrayr A Sayadian
(74) *Attorney, Agent, or Firm* — Muncy, Geissler, Olds & Lowe, P.C.

(57) ABSTRACT

An advanced metal-nitride-oxide-silicon (MNOS) multiple time programmable (MTP) memory is provided. In an example, an apparatus includes a two field effect transistor (2T field FET) metal-nitride-oxide-silicon (MNOS) MTP memory. The 2T field FET MNOS MTP memory can include an interlayer dielectric (ILD) oxide region that is formed on a well and separates respective gates of first and second transistors from the well. A control gate is located between the respective gates of the first and second transistors, and a silicon-nitride-oxide (SiN) region is located between a metal portion of the control gate and a portion of the ILD oxide region.

7 Claims, 21 Drawing Sheets

(51) Int. Cl.
*H01L 29/66* (2006.01)
*H01L 29/792* (2006.01)
*H01L 27/115* (2006.01)

(56) References Cited

U.S. PATENT DOCUMENTS

| | | |
|---|---|---|
| 8,519,465 B2 | 8/2013 | Kim et al. |
| 2011/0031552 A1 | 2/2011 | Iwamatsu et al. |
| 2011/0057245 A1 | 3/2011 | Nagai |
| 2013/0280899 A1 | 10/2013 | Chen et al. |

OTHER PUBLICATIONS

Shen, W.C., et al., "32nm Strained Nitride MTP Cell by Fully CMOS Logic Compatible Process," 2012 International Symposium on VLSI Technology, Systems, and Applications (VLSI-TSA), 2012, pp. 1-2.
International Search Report and Written Opinion—PCT/US2015/030891—ISA/EPO—Jul. 29, 2015.

| NMOS MTP | | SL | PG1 | CG | PG2 | BL | PWell |
|---|---|---|---|---|---|---|---|
| Select | Select | 0 | 0.7 | 1.8 | 0.7 | 1 | 0 |
| | Unselect | 0 | 0 | 0 | 0 | 0 | 0 |
| Program | Select | 3.5 | 3.5 | 5 | 3.5 | 0 | 0 |
| | Unselect | 0 | 0 | 0 | 0 | 0 | 0 |
| Erase | Select | 0 | 3.5 | 5 | 3.5 | 0 | 0 |
| | Unselect | 0 | 0 | 0 | 0 | 0 | 0 |

| PMOS MTP | | SL | PG1 | CG | PG2 | BL | PWell |
|---|---|---|---|---|---|---|---|
| Select | Select | 0 | 0 | 0 | 0 | 1 | 1.8 |
| | Unselect | 0 | 1.8 | 1.8 | 1.8 | 0 | 1.8 |
| Program | Select | 0 | 0 | 0 | 0 | 3.5 | 3.5 |
| | Unselect | 0 | 3.5 | 0 | 3.5 | 0 | 3.5 |
| Erase | Select | 0 | 0 | 2 | 0 | 0 | 0 |
| | Unselect | 0 | 0 | 0 | 0 | 0 | 0 |

FIG. 2

ADVANCED METAL-NITRIDE-OXIDE-SILICON MULTIPLE-TIME PROGRAMMABLE MEMORY

FIELD OF DISCLOSURE

This disclosure relates generally to electronics, and more specifically, but not exclusively, to an advanced metal-nitride-oxide-silicon (MNOS) multiple time programmable (MTP) memory.

BACKGROUND

Random access memory (RAM) is a ubiquitous component of modern digital architectures. RAM can be a stand-alone device, or can be integrated in a device that uses RAM, such as a microprocessor, microcontroller, application specific integrated circuit (ASIC), system-on-chip (SoC), and other like devices. RAM can be volatile or non-volatile. Volatile RAM loses its stored information whenever power is removed. Non-volatile RAM can maintain its memory contents even when power is removed. Although non-volatile RAM has advantages, such as an ability to retain stored information without applied power, conventional non-volatile RAM has slower read/write times and consumes more power than volatile RAM.

There is increasing market demand for integrated circuits, such as system on a chip (SoC) processors, which include embedded non-volatile memory (NVM) (e.g., an eFlash memory). Embedded NVM memory can be used to store sophisticated feature-rich software and firmware for long periods of time, and also provides quick programming and erasing of data. Conventional embedded NVM is an example of a type of multiple-time programmable (MTP) memory.

One type of conventional NVM memory is a charge-trapping silicon-oxide-nitride-oxide-silicon (SONOS) transistor having a feature size of 65 nm. The charge-trapping SONOS transistor stores data by trapping a charge in the nitride layer (i.e., the "N layer" in "SONOS"). This technology requires multiple masks to fabricate, which leads to high fabrication costs that are ultimately passed on to consumers. The conventional charge-trapping SONOS transistor technology also has fabrication process restrictions that limit advancements in feature size reduction. For example, the fabrication process restrictions (e.g., gate space restrictions) prevent the conventional charge-trapping SONOS transistor technology from being fabricated using 20 nm SoC and 16 nm FET advanced technologies. There are currently no MTP memories available in advanced technologies, such as 20 nm SoC and 16 nm FET advanced technologies, which do not have excessive costs associated with development and fabrication.

Accordingly, there are long-felt industry needs for methods and apparatus that improve upon conventional methods and apparatus, including the improved methods and apparatus provided hereby.

SUMMARY

This summary provides a basic understanding of some aspects of the present teachings. This summary is not exhaustive in detail, and is neither intended to identify all critical features, nor intended to limit the scope of the claims.

Exemplary methods and apparatus for programming a two-gate field effect transistor (2T field FET) metal-nitride-oxide-silicon (MNOS) multi-time programmable (MTP) memory are provided.

An exemplary method includes biasing a first transistor in the 2T field FET MNOS MTP memory and biasing a second transistor in the 2T field FET MNOS MTP memory. The biasing of the first and second transistors causes an electron to be stored in a silicon-nitride-oxide region of the 2T field FET MNOS MTP memory due to Fowler-Nordheim tunneling.

Another exemplary method for programming a two-gate field effect transistor (2T field FET) metal-nitride-oxide-silicon (MNOS) multi-time programmable (MTP) memory includes biasing a first transistor in the 2T field FET MNOS MTP memory and biasing a second transistor in the 2T field FET MNOS MTP memory. The biasing of the first and second transistors causes an electron to be stored in a silicon-nitride-oxide region of the 2T field FET MNOS MTP memory due to carrier hot injection.

In another example, provided is an apparatus including an advanced metal-nitride-oxide-silicon (MNOS) multiple time programmable (MTP) memory. The apparatus includes a two-gate field effect transistor (2T field FET) metal-nitride-oxide-silicon (MNOS) multi-time programmable (MTP) memory. The 2T field FET MNOS MTP memory includes a substrate, a first transistor formed on the substrate, a second transistor formed on the substrate, and an interlayer dielectric (ILD) oxide region that is formed on a well and separates respective gates of the first and second transistors from the well. A portion of the ILD oxide region is configured as a fin. The 2T field FET MNOS MTP memory also includes a control gate including a metal portion. The control gate is formed around a portion of the fin-shaped portion of the interlayer dielectric (ILD) oxide region and substantially between the respective gates of the first and second program line transistors. The 2T field FET MNOS MTP memory also includes a silicon-nitride-oxide region formed on the fin-shaped portion of the ILD oxide region between the metal portion of the control gate and the fin-shaped portion of the ILD oxide region. The 2T field FET MNOS MTP memory can also include a metal ring formed substantially perpendicular to the ILD oxide region and coupling a gate of the first transistor to a gate of the second transistor. The 2T field FET MNOS MTP memory can be a PMOS device. The 2T field FET MNOS MTP memory can be an NMOS device. The apparatus can also include at least one of a mobile device, a base station, a terminal, a set top box, a music player, a video player, an entertainment unit, a navigation device, a communications device, a personal digital assistant (PDA), a fixed location data unit, and a computer, of which the 2T field FET MNOS MTP memory is a constituent part.

At least a part of the apparatus can be integrated on a semiconductor die. Further, at least a part of the apparatus can include a device, such as a mobile device, a base station, a set top box, a music player, a video player, an entertainment unit, a navigation device, a communications device, a personal digital assistant (PDA), a fixed location data unit, and/or a computer, with another part of the apparatus being a constituent part of the device.

In a further example, provided is a non-transitory computer-readable medium, comprising lithographic device-executable instructions stored thereon configured to cause a lithographic device to fabricate at least a part of the apparatus as an integrated circuit.

The foregoing broadly outlines some of the features and technical advantages of the present teachings in order that the detailed description and drawings can be better understood. Additional features and advantages are also described in the detailed description. The conception and disclosed embodiments can be readily utilized as a basis for modifying or designing other structures for carrying out the same purposes of the present teachings. Such equivalent constructions do not depart from the technology of the teachings as set forth in the claims. The inventive features that are characteristic of the teachings, together with further objects and advantages, are better understood from the detailed description and the accompanying figures. Each of the figures is provided for the purpose of illustration and description only, and does not limit the present teachings.

BRIEF DESCRIPTION OF THE DRAWINGS

The accompanying drawings are presented to describe examples of the present teachings, and are not limiting.

FIG. 2 depicts exemplary voltages used to operate NMOS and PMOS MTP devices.

Figure 1:
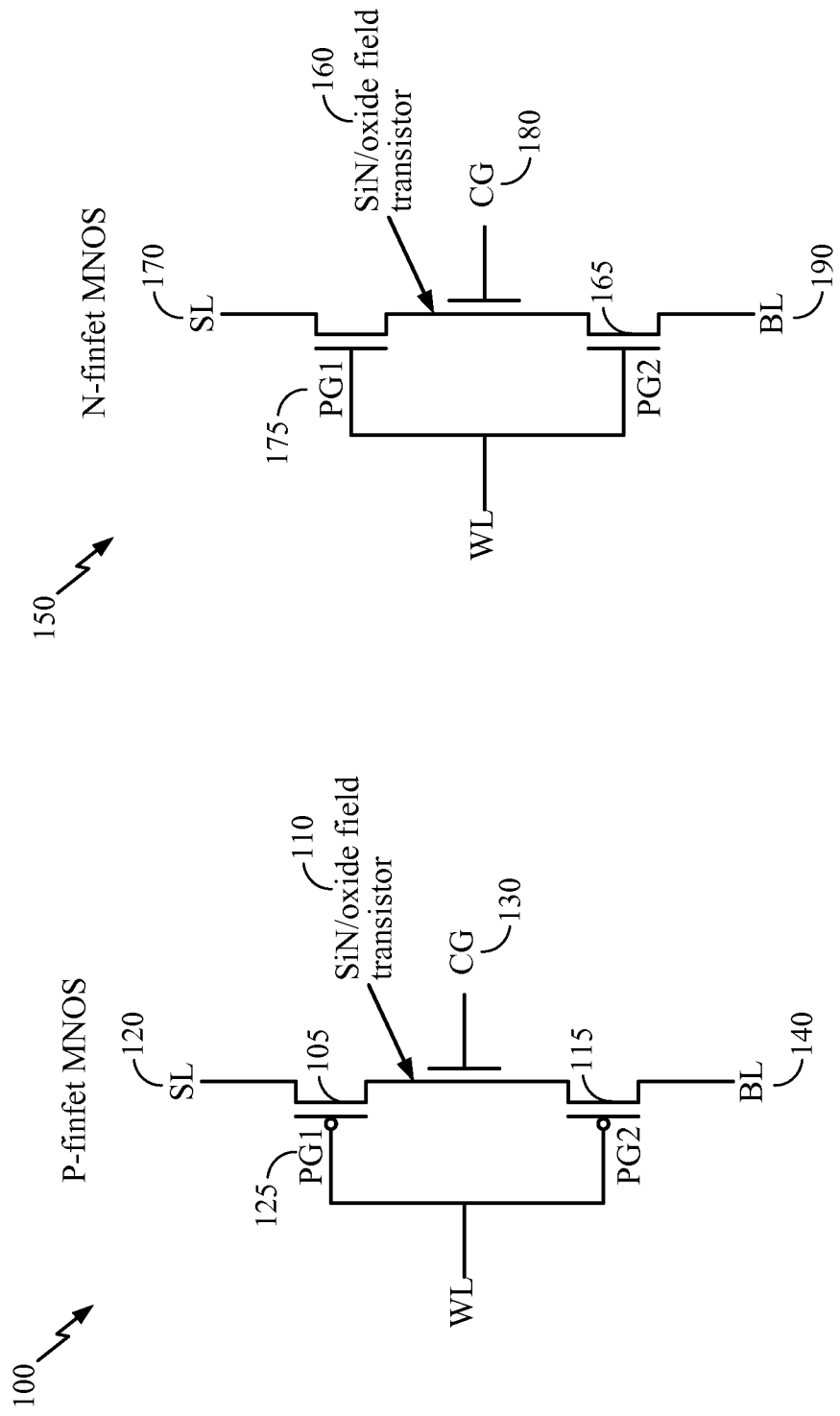
FIG. 1 depicts schematics of an exemplary P-FET MNOS MTP device and an exemplary N-FET MNOS MTP device.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Introduction

An advanced metal-nitride-oxide-silicon (MNOS) multiple time programmable (MTP) memory is provided. In an example, provided is an apparatus, comprising a two-gate field effect transistor (2T field FET) metal-nitride-oxide-silicon (MNOS) multi-time programmable (MTP) memory.

The exemplary apparatuses and methods disclosed herein advantageously address the long-felt industry needs, as well as other previously unidentified needs, and mitigate shortcomings of the conventional methods and apparatus. For example, advantages provided by the apparatuses and methods disclosed herein include improvements in scalability, development costs, and fabrication costs over conventional devices. Other advantages include improved device performance and reduced power consumption of devices including the technology provided hereby.

Exemplary embodiments are disclosed in this application's text and drawings. Alternate embodiments can be devised without departing from the scope of the invention. Additionally, conventional elements of the current teachings may not be described in detail, or may be omitted, to avoid obscuring aspects of the current teachings.

As used herein, the term "exemplary" means "serving as an example, instance, or illustration." Any embodiment described as "exemplary" is not necessarily to be construed as preferred or advantageous over other embodiments. Likewise, the term "embodiments of the invention" does not require that all embodiments of the invention include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

The terminology used herein is for the purpose of describing particular embodiments only and is not intended to be limiting. As used herein, the singular forms "a," "an," and "the" are intended to include the plural forms as well, unless the context clearly indicates otherwise. Further, the terms "comprises," "comprising," "includes," and "including," when used herein, specify a presence of stated features, integers, steps, operations, elements, and/or components, but do not preclude the presence and/or addition of one or more other features, integers, steps, operations, elements, components, and/or groups thereof.

Spatial descriptions (e.g., "top," "middle," "bottom," "left," "center," "right," "up," "down," "vertical," "horizontal," etc.) used herein are for illustrative purposes only, and are not limiting descriptors. Practical implementations of the structures described hereby can be spatially arranged in any orientation providing the functions described hereby. In addition, in using the term "adjacent" herein to describe a spatial relationship between integrated circuit elements, the adjacent integrated circuit elements need not be in direct physical contact, and other integrated circuit elements can be located between the adjacent integrated circuit elements.

The provided apparatuses can be a part of and/or coupled to, an electronic device, such as, but not limited to, a mobile device, a mobile telephone, a wireless device, a personal data assistant (PDA), a hand-held computer, a portable computer, a GPS receiver, a navigation device, a camera, an audio player, a camcorder, a game console, a watch, a clock, a calculator, a television, a flat panel display, a computer monitor, an auto display (e.g., an odometer display, etc.), a cockpit control and/or display, a display coupled to a camera (e.g., a rear and/or side view camera in a vehicle), an electronic photograph frame, an electronic billboard, an electronic sign, and/or a projector.

The provided apparatuses can be a part of and/or coupled to a "mobile device," such as, and not limited to, a mobile phone, a mobile communication device, a pager, a personal digital assistant, a personal information manager, a mobile hand-held computer, a portable computer, a wireless device, a wireless modem, an electronic device having a memory, and/or other types of portable electronic devices typically carried by a person and having communication capabilities (e.g., wireless, cellular, infrared, short-range radio, etc.). Further, the terms "user equipment" (UE), "mobile terminal," "mobile device," and "wireless device" can be interchangeable.

ABBREVIATIONS

The following list of frequently-used abbreviations and acronyms are provided to assist in comprehending the current disclosure, and are not provided as limitations.

2T field FET—two-gate field effect transistor
BL—bit line
CG—control gate
CT—contact terminal
CHE—channel hot electron. A condition in which channel carriers travel from a source to a gate oxide and SiN spacer instead of a drain due to a high voltage difference between a gate, a drain, and a source.
FinFET—a trigate field effect transistor (FET) in which a fin-shaped region is a raised channel. A gate electrode can be formed such that the gate electrode is adjacent to three sides of the fin.
FN—Fowler-Nordheim. In an example of Fowler-Nordheim tunneling, a crystalline solid (e.g., metal) emits charge carriers (e.g., electrons) in a presence of a high electric field.
ILD oxide—interlayer dielectric oxide, which can be used to electrically separate conductive structures such as interconnect lines.
LDD—lightly doped drain. An exemplary lightly doped drain is a structure in which a drain region is lightly doped near a channel to reduce hot electron effects.
M0, M1—metal layer number zero, metal layer number one, etc.
MNOS—metal-nitride-oxide-silicon
MTP—multiple-time programmable memory (e.g., a non-volatile memory)
NMOS—n-type metal-oxide-semiconductor
nVT—normal threshold voltage (Vt)
PMOS—p-type metal-oxide-semiconductor
PG1, PG2—program gate number one, program gate number two, etc.
SG—select gate
SL—source line
SoC—system on chip
SONOS—silicon-oxide-nitride-oxide-silicon
STI—shallow trench isolation. A shallow trench isolation structure is a device feature that reduces charge carrier leakage between adjacent semiconductor structures.
ULVT—ultra low threshold voltage (Vt)
V0, V1—vertical interconnect access (i.e., via) layer number
Vt—threshold voltage
WL—word line

DESCRIPTION OF THE FIGURES

FIG. 1 depicts schematics of an exemplary P-FET MNOS MTP device 100 and an exemplary N-FET MNOS MTP device 150. Details about the structure and operation of the N-FET MNOS MTP device 150 can be found in FIGS. 1-10 and 19-21. Details about the structure and operation of the P-FET MNOS MTP device 100 can be found in FIGS. 1 and 11-21. The N-FET MNOS MTP device 150 and the P-FET MNOS MTP device 100 can be a planar MOS device or a FinFET device. The exemplary P-FET MNOS MTP device 100 and the exemplary N-FET MNOS MTP device 150 have lower program and erase voltages than a floating gate MTP device.

The P-FET MNOS MTP device 100 has a first transistor 105 that is a P-FET MNOS transistor, a second transistor 110 that is a silicon nitride (SiN)/oxide field transistor, and a third transistor 115 that is a P-FET MNOS transistor. The source of the first transistor 105 is a source line (SL) 120 and the gate of the first transistor 105 is a first program gate (PG1) 125. The PG1 125 is also a word line (WL), and can be used for device selecting, programming, and erasing. The first transistor 105 is coupled to the second transistor 110, and can be a regular Vt device.

The second transistor 110 is electrically located between the first transistor 105 and the third transistor 115, and can be a substantially zero Vt device. The second transistor 110 has a SiN cap and SiN spacers that can be used to store charge carriers in an absence of voltage applied to terminals of the P-FET MNOS MTP device 100. When the SiN cap and/or the SiN spacers store charge carriers or do not store charge carriers, the P-FET MNOS MTP device 100 can represent a logic "0" in one of these states and represent a logic "1" in the other state, thus allowing the P-FET MNOS MTP device 100 to be used as an MTP memory element. The gate of the second transistor is a control gate (CG) 130 that can be used for device programming and erasing.

The third transistor 115 is a P-FET MNOS transistor, and can be a regular Vt device. The third transistor 115 is coupled to the second transistor 110 and the gate of the third transistor 115 is a second program gate (PG2) 135 that is coupled to the PG1 125. The PG2 135 is also the WL. The drain of the third transistor 115 is a bit line (BL) 140.

The N-FET MNOS MTP device 150 has a fourth transistor 155 that is an N-FET MNOS transistor, a fifth transistor 160 that is an SiN/oxide field transistor, and a sixth transistor 165 that is an N-FET MNOS transistor. The drain of the fourth transistor 155 is a select line (SL) 170 and the gate of the fourth transistor 155 is a first program gate (PG1) 175. The PG1 175 is also a word line (WL). The fourth transistor 155 is coupled to the fifth transistor 160.

The fifth transistor 160 is electrically located between the fourth transistor 155 and the sixth transistor 165. The fifth transistor 160 has a SiN cap and SiN spacers that can be used to store charge carriers in an absence of voltage applied to terminals of the N-FET MNOS MTP device 150. When the SiN cap and/or the SiN spacers store charge carriers or do not store charge carriers, the N-FET MNOS MTP device 150 can represent a logic "0" in one of these states and represent a logic "1" in the other state, thus allowing the N-FET MNOS MTP device 150 to be used as an MTP memory element. The gate of the fifth transistor is a control gate (CG) 180.

The sixth transistor 165 is an N-FET MNOS transistor. The sixth transistor 165 is coupled to the second transistor 110 and the gate of the sixth transistor 165 is a second program gate (PG2) 185 that is coupled to the PG1 175. The PG2 185 is also the WL. The source of the sixth transistor 165 is a bit line (BL) 190.

FIG. 2 depicts exemplary voltages applied to terminals of an NMOS MTP device (e.g., the N-FET MNOS MTP device 150) and a PMOS MTP device (e.g., the P-FET MNOS MTP device 100) to operate the respective MTP device. The voltages depicted are exemplary, and a person skilled in the art can, using this disclosure, design an NMOS device (e.g., the N-FET MNOS MTP device 150) and/or a PMOS MTP device (e.g., the P-FET MNOS MTP device 100) to operate using voltages other than those depicted in FIG. 2.

In FIG. 2, the exemplary voltages (e.g., relative to ground) are described as being applied to terminals such as a source line (SL) (e.g., the SL 120 and/or the SL 170), a first program gate (PG1) (e.g., the PG1 125 and/or the PG1 175), a control gate (CG) (e.g., the CG 130 and/or the CG 180), a second program gate (PG2) (e.g., the PG2 135 and/or the PG2 185), a bitline (BL) (e.g., the BL 140 and/or the BL 190), and a respective PWell or NWell. Application of these voltages selects a function to perform on the NMOS MTP device and/or the PMOS MTP device. Possible functions include selecting and unselecting: programming, erasing, and reading the respective MTP device. Further details about programming, erasing, and reading functions are provided in FIGS. 3-18.

Figure 3:
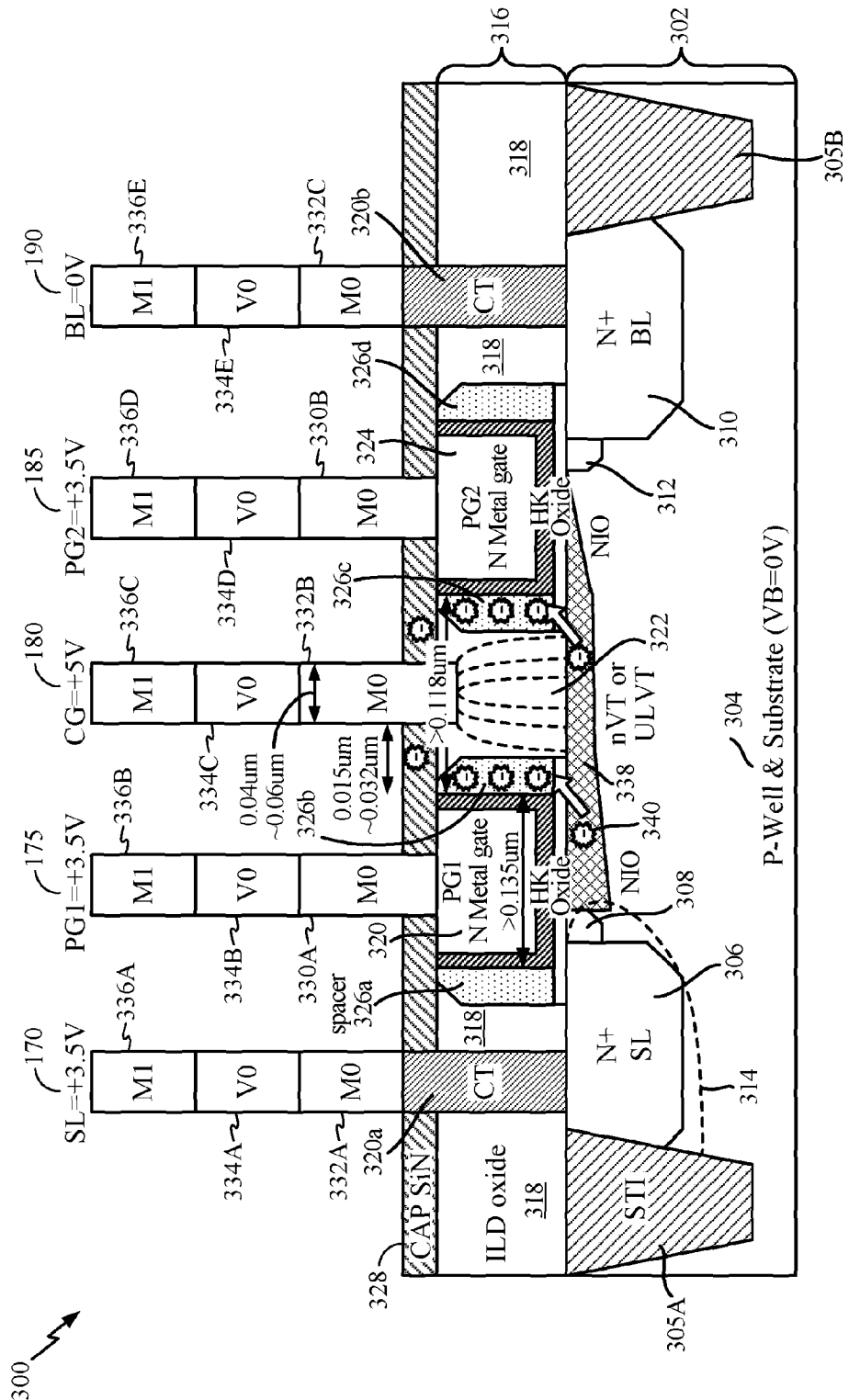
FIG. 3 depicts an exemplary NMOS MTP device during programming using channel hot carrier ejection.

FIG. 3 depicts the N-FET MNOS MTP device 150 during programming using channel hot carrier ejection 300, and provides further detail about an exemplary structure of the N-FET MNOS MTP device 150.

The N-FET MNOS MTP device 150 includes a first layer 302 including a substrate having a P-well 304, first and second shallow trench isolation (STI) structures 305A, 305B on either side of the P-well 304, an N+ drain diffusion 306 adjacent to the P-well 304 and that is the SL 170, an N+ drain extension 308 from the N+ drain diffusion 306, an N+ source diffusion 310 adjacent to the P-well 304 and that is the BL 190, and an N+ source extension 312 from the N+ source diffusion 310. The dashed lines represent a substantial boundary of a depletion region 314. The boundaries of a depletion region in the N-FET MNOS MTP device 150 can be limited using a halo implant.

A second layer 316 of the N-FET MNOS MTP device 150 includes an insulating interlayer dielectric oxide (ILD) portion 318 through which passes a first contact terminal (CT) 320A of the SL 170 and a second CT 320B of the BL 190. A portion of the ILD oxide portion 318 can be configured as a fin. The second layer 316 also includes three metal gates—a PG1 gate 320, a CG gate 322, and a PG2 gate 324, which are separated by, and adjacent to, SiN spacers 326A-D. The ILD oxide portion 318 separates the PG1 gate 320, the CG gate 322, and the PG2 gate 324 from the P-well 304. The CG gate 322 can be formed adjacent to the fin-shaped portion of the ILD oxide region 318.

A SiN cap 328 is formed on the ILD oxide portion 318; the SiN spacers 326A-D; the three metal gates—the PG1 gate 320, the CG gate 322, and the PG2 gate 324; and adjacent to the metal lines 332A-332C that are respectively coupled to the first CT 320A, the second CT 320B, and metal lines 330A-332B, 330B that are coupled to the PG1 gate 320, the CG gate 322, and the PG2 gate 324. The SiN cap 328 can be formed on the fin-shaped portion of the interlayer dielectric (ILD) oxide portion 318. The SiN spacer portion 326 and/or the SiN cap 328 can be used as a charge carrier storage layer. An oxide portion that is 50 angstroms thick can be capable of storing a charge carrier for approximately 10 years. The low read voltage requirements of the PG1 gate 320, the CG gate 322, and the PG2 gate 324 also leads to the disclosed devices being capable of storing a charge carrier for approximately 10 years. The data retention duration of the disclosed devices can be increased using refresh and automatic circuit repair techniques.

The metal lines 332A-332C and the metal lines 330A-330B can optionally be coupled to a respective vertical interconnect access ("via0") 334A-E and/or an additional layer (M1) of metal lines 336A-E.

During the programming of the N-FET MNOS MTP device 150 using channel hot carrier ejection (CHE) 300, the applied DC voltages can be:

$V_{SL} = +3.5V$
$V_{PG1} = +3.5V$
$V_{CG} = +5V$
$V_{PG2} = +3.5V$
$V_{BL} = 0V$
$V_{Well}$ (i.e., VB) = 0V As a result of this biasing, a channel 338 extends from the N+ drain diffusion 306 toward the N+ source extension 312 due to $V_{SL} > V_{BL}$, $V_{PG1} > V_{BL}$, and $V_{PG2} > V_{BL}$. However, $V_{CG} > V_{SL}$ and $V_{CG} > V_{PG1}$, thus, negative charge carriers 340 (i.e., electrons) are drawn from the N+ drain diffusion 306 and the SL 170, the N+ drain extension 308, and the channel 338 toward the CG metal gate 322 through the SiN spacers 326B-326C and the SiN cap 328. When applied voltages are removed, negative charge carriers 340 remain stored in the SiN spacers 326B-326C and the SiN cap 328, and the N-FET MNOS MTP device 150 is programmed.

Figure 4:
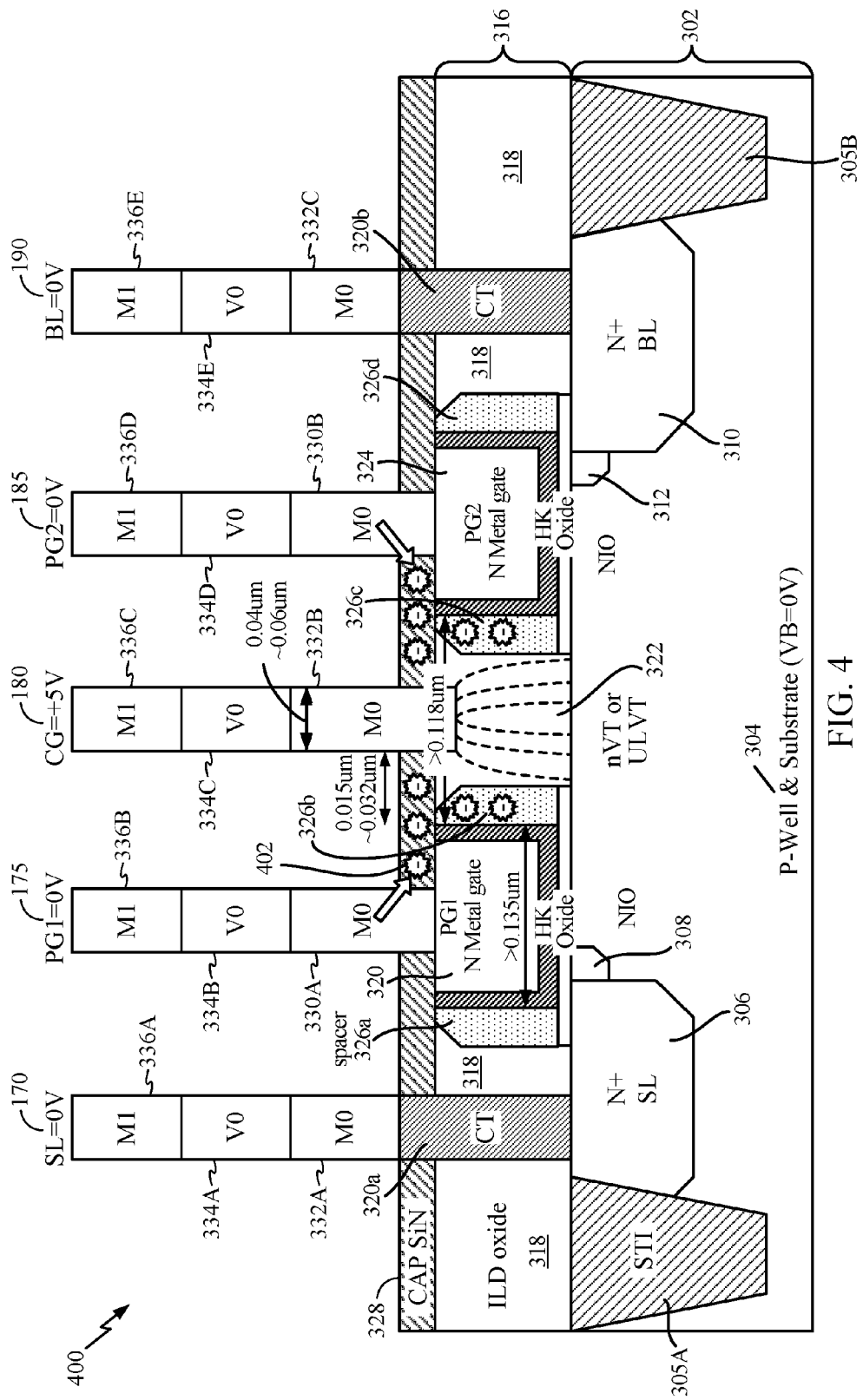
FIG. 4 depicts an exemplary NMOS MTP device during programming using top electron Fowler-Nordheim tunneling.
Figure 5:
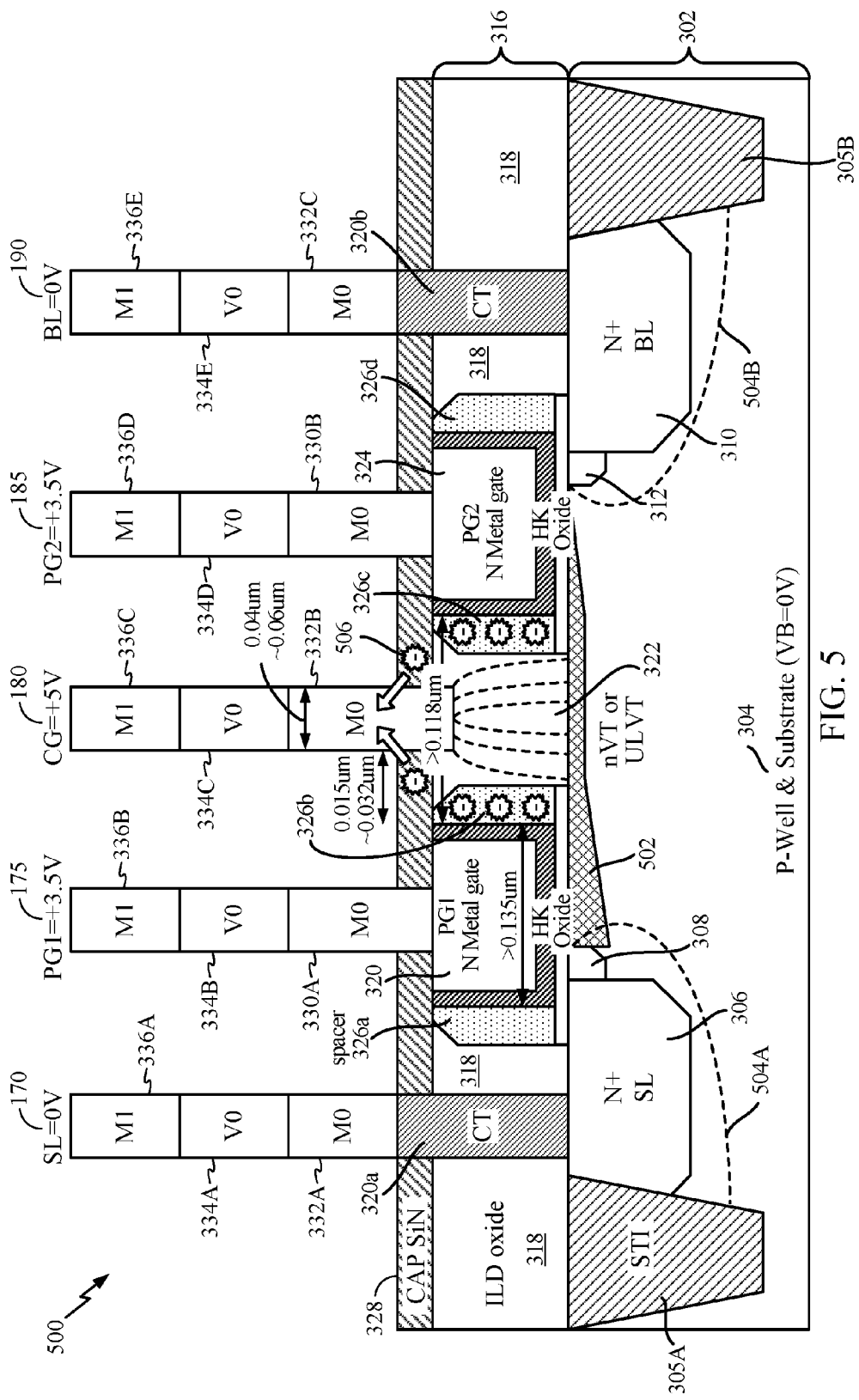
FIG. 5 depicts an exemplary NMOS MTP device during erasing using channel electron Fowler-Nordheim tunneling.

FIG. 4 depicts the N-FET MNOS MTP device 150 during programming using top electron Fowler-Nordheim tunneling 400. During programming using top electron Fowler-Nordheim tunneling, the applied AC voltages can be:

$V_{SL}$=0V
$V_{PG1}$=0V
$V_{CG}$=+5V
$V_{PG2}$=0V
$V_{BL}$=0V
$V_{Well}$ (i.e., VB)=0V As a result of this biasing, the $V_{CG}>>>V_{PG1}$ and $V_{CG}>>>V_{PG2}$, while $V_{SL}=V_{PG1}$ and $V_{PG2}=V_{BL}$. Due to the high electric field between the PG1 metal gate 320 and the CG gate 322, as well as between the PG2 metal gate 324 and the CG gate 322, Fowler-Nordheim tunneling occurs, and negative charge carriers 402 are emitted from the metal lines 330A-330B that are coupled to the PG1 gate 320 and the PG2 gate 324. The negative charge carriers 402 are drawn toward the CG gate 322 through the SiN spacers 326B-326C and the SiN cap 328. When applied voltages are removed, the negative charge carriers 402 remain stored in the SiN spacers 326B-326C and the SiN cap 328, and the N-FET MNOS MTP device 150 is thus programmed FIG. 5 depicts the N-FET MNOS MTP device 150 during erasing using channel electron Fowler-Nordheim tunneling 500. During erasing using channel electron Fowler-Nordheim tunneling, the applied AC voltages can be:

$V_{SL}$=0V
$V_{PG1}$=+3.5V
$V_{CG}$=+5V
$V_{PG2}$=+3.5V
$V_{BL}$=0V
$V_{Well}$ (i.e., VB)=0V As a result of this biasing, a channel 502 extends from the N+ drain diffusion 306 toward the N+ source extension 312 and depletion regions 504A-504B are created around the N+ drain diffusion 306 and the N+ drain extension 308, as well as around the N+ source diffusion 310 and the N+ source extension 312 due to the $V_{CG}>V_{PG1}>V_{SL}$ and $V_{CG}>V_{PG2}>V_{BL}$. Due to the high electric field between $V_{CG}$ and $V_{SL}$, as well as between $V_{CG}$ and $V_{BL}$, Fowler-Nordheim tunneling occurs, and negative charge carriers 506 are drawn from the SiN spacers 326B-326C and the SiN cap 328. The negative charge carriers 506 are drawn toward the metal line 332B that is coupled to the CG gate 322. When applied voltages are removed, the negative charge carriers 506 no longer remain stored in the SiN spacers 326B-326C and the SiN cap 328, and the N-FET MNOS MTP device 150 is thus erased using channel electron Fowler-Nordheim tunneling.

Figure 6:
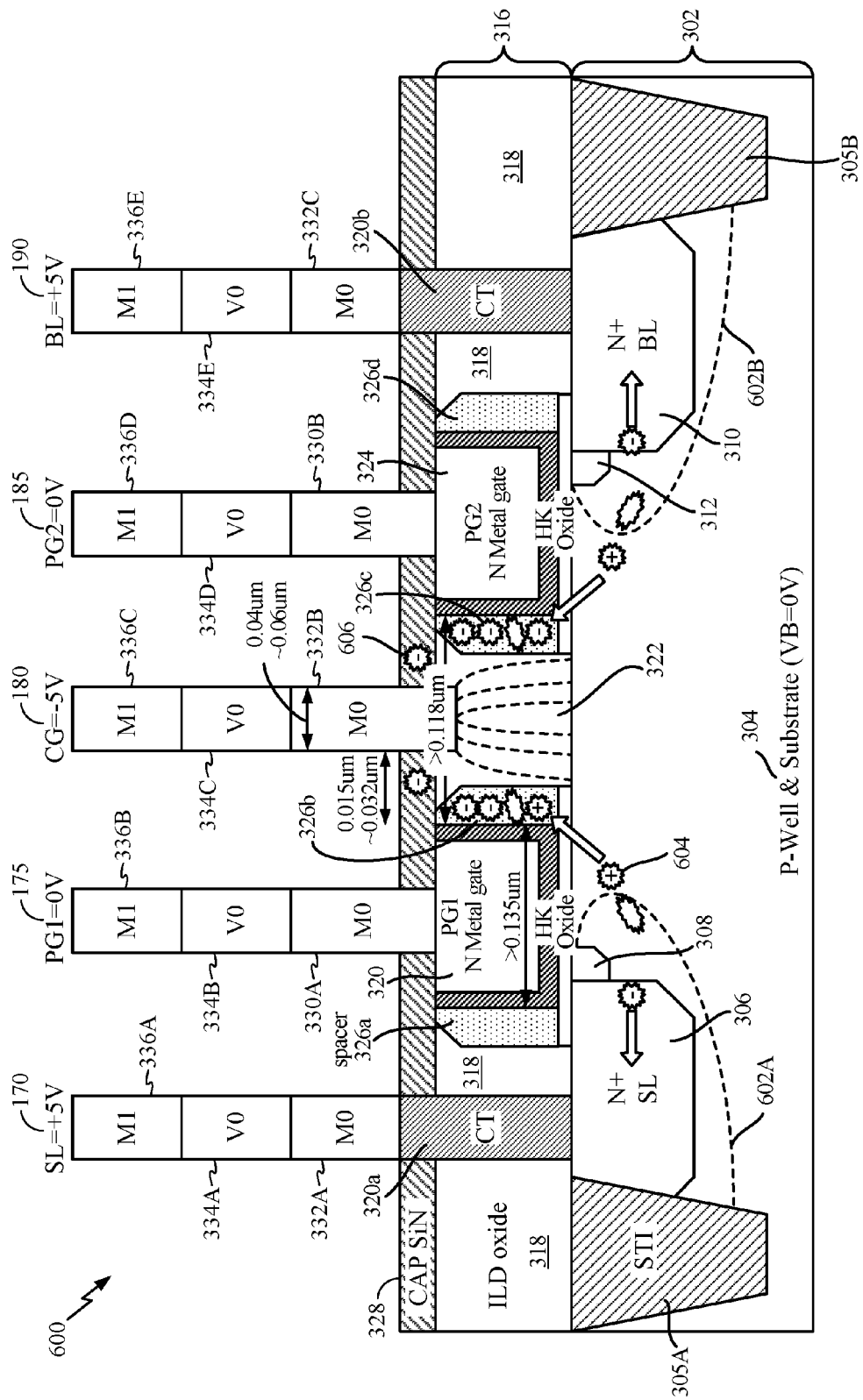
FIG. 6 depicts an exemplary NMOS MTP device during erasing using channel hot carrier ejection.

FIG. 6 depicts the N-FET MNOS MTP device 150 during erasing using source and drain side hot carrier ejection 600. During erasing of the N-FET MNOS MTP device 150 using hot carrier ejection (HCE), the applied AC voltages can be:

$V_{SL}$=+5V
$V_{PG1}$=0V
$V_{CG}$=−5V
$V_{PG2}$=0V
$V_{BL}$=+5V
$V_{Well}$ (i.e., VB)=0V As a result of this biasing, depletion regions 602A-602B are created around the N+ drain diffusion 306 and the N+ drain extension 308, as well as around the N+ source diffusion 310 and the N+ source extension 312 due to $V_{SL}>>>V_{PG1}>>>V_{CG}$ and $V_{BL}>>>V_{PG2}>>>V_{CG}$. Thus, positive charge carriers 604 (i.e., hot holes) are drawn from the depletion regions 602A-602B toward the CG gate 322 through the SiN spacers 326B-326C and the SiN cap 328. The positive charge carriers 604 combine with stored negative charge carriers 606 (i.e., the electrons return to a valence band from a conduction band) in the SiN spacers 326A-326B and the SiN cap 328 to remove the negative charge carriers stored in the SiN spacers 326A-326B and the SiN cap 328. When applied voltages are removed, the negative charge carriers 606 no longer remain stored in the SiN spacers 326A-326B and the SiN cap 328, and the N-FET MNOS MTP device 150 is thus erased using hot hole carrier ejection.

Figure 7:
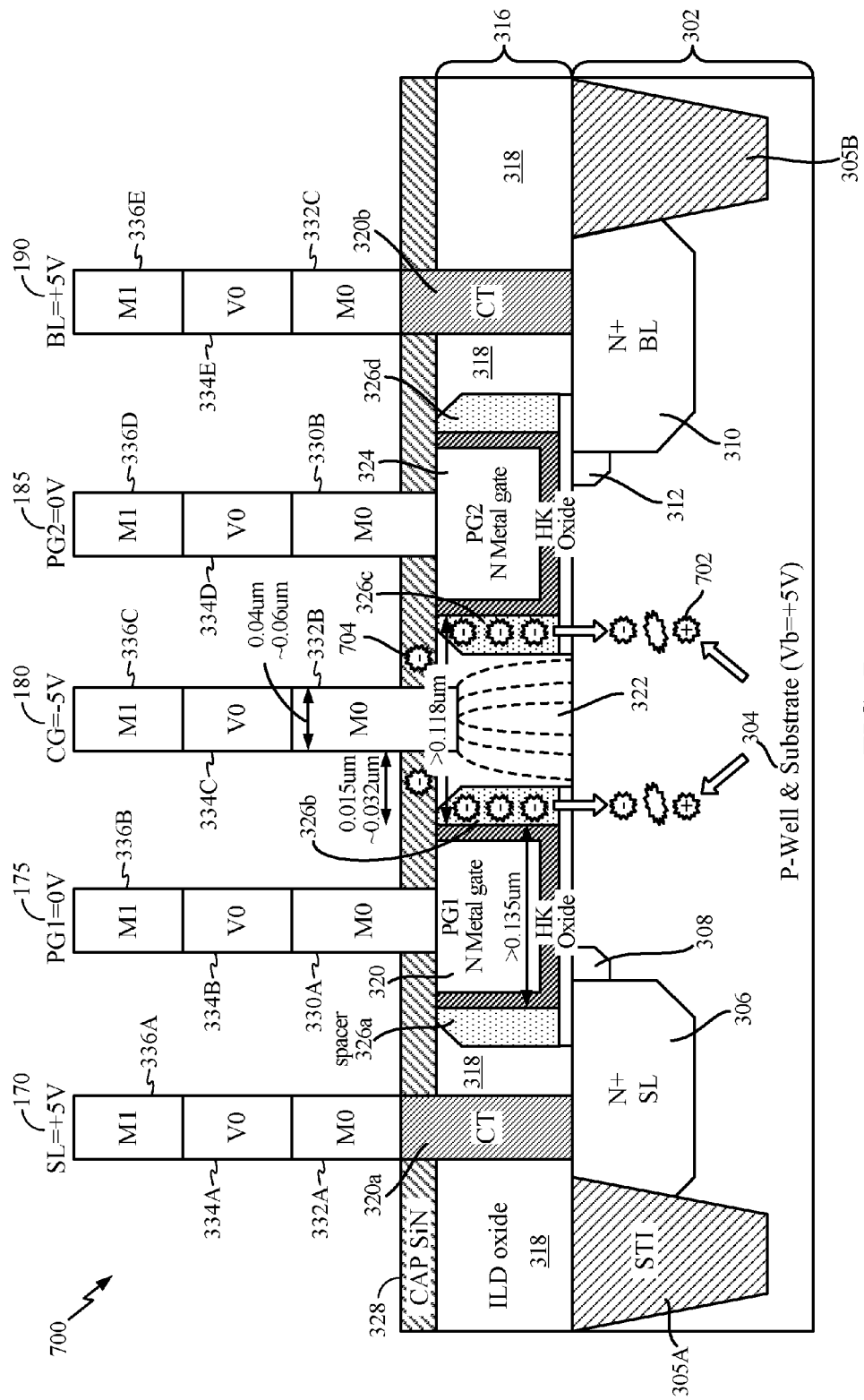
FIG. 7 depicts an exemplary NMOS MTP device during erasing using body electron Fowler-Nordheim tunneling.

FIG. 7 depicts the N-FET MNOS MTP device 150 during erasing using body electron Fowler-Nordheim tunneling 700. During erasing using body electron Fowler-Nordheim tunneling, the applied AC voltages can be:

$V_{SL}$=+5V
$V_{PG1}$=0V
$V_{CG}$=−5V
$V_{PG2}$=0V
$V_{BL}$=+5V
$V_{Well}$ (i.e., VB)=+5V As a result of this biasing, $V_{SL}>>>V_{PG1}>>>V_{CG}$ and $V_{BL}>>>V_{PG2}>>>V_{CG}$. Also, $V_{Well}>>>V_{CG}$. Due to the high electric field between the PWell 304 and the CG gate 322, Fowler-Nordheim tunneling occurs, and positive charge carriers 702 are emitted from the P-Well 304. The positive charge carriers 702 are drawn toward the metal line 332B that is coupled to the CG gate 322 and are drawn toward the SiN spacers 326B-326C and the SiN cap 328. The positive charge carriers 702 combine with stored negative charge carriers 704 (i.e., the electrons return to a valence band from a conduction band) from the SiN spacers 326B-326C and the SiN cap 328 to remove the negative charge carriers 704 stored in the SiN spacers 326B-326C and the SiN cap 328. When applied voltages are removed, negative charge carriers 704 no longer remain stored in the SiN spacers 326B-326C and the SiN cap 328, and the N-FET MNOS MTP device 150 is thus erased using body electron Fowler-Nordheim tunneling.

Figure 8:
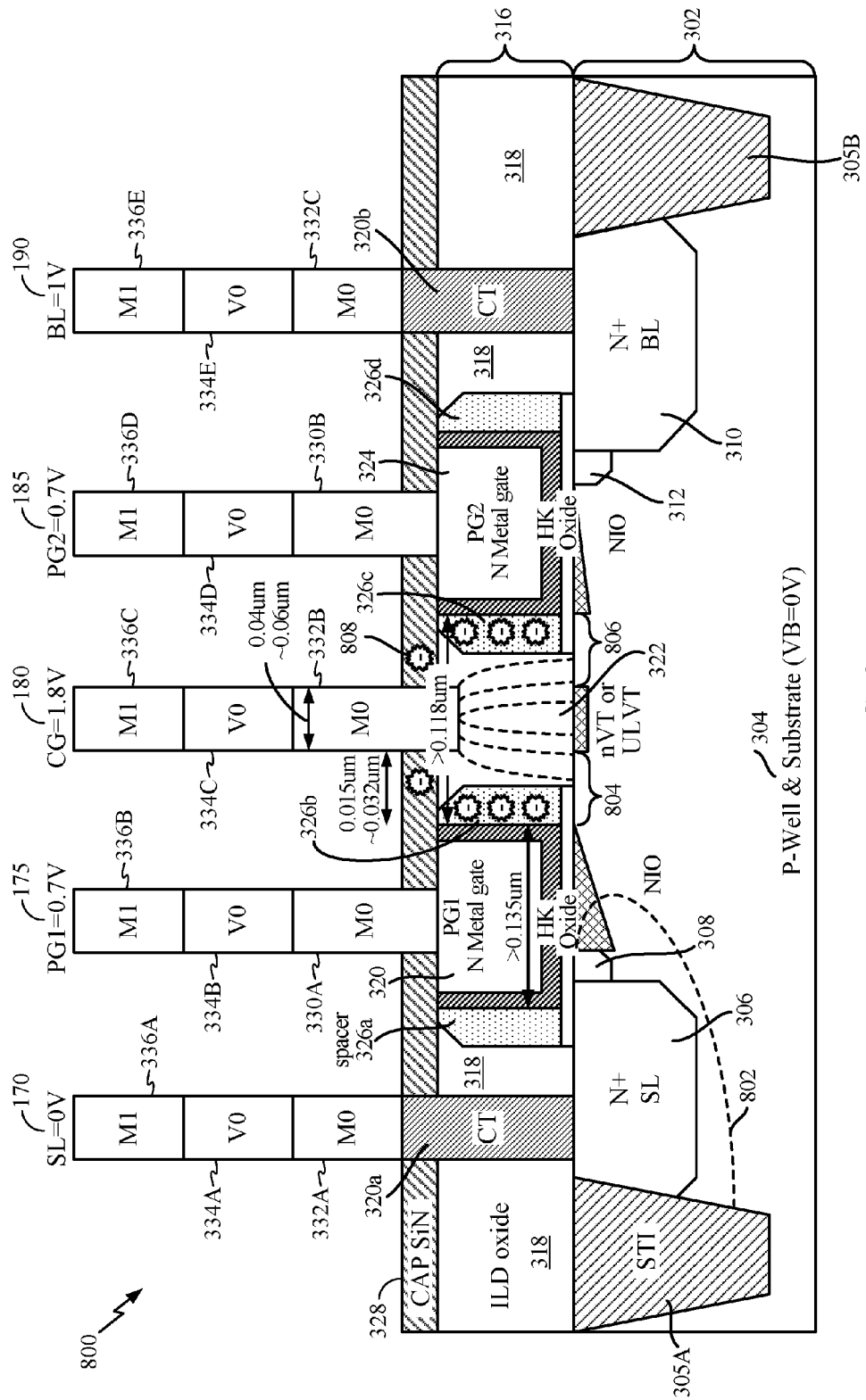
FIG. 8 depicts an exemplary programmed NMOS MTP device during reading.

FIG. 8 depicts reading the N-FET MNOS MTP device 150 when the N-FET MNOS MTP device 150 is programmed During reading the N-FET MNOS MTP device 150 when programmed 800, the applied AC voltages can be:

$V_{SL}$=0V
$V_{PG1}$=+0.7V
$V_{CG}$=+1.8V
$V_{PG2}$=+0.7V
$V_{BL}$=+1V
$V_{Well}$ (i.e., VB)=0V As a result of this biasing, $V_{CG}>V_{PG1}>V_{SL}$ and $V_{CG}>V_{PG2}<V_{BL}$. A depletion region 802 is created around the N+ drain diffusion 306 and the N+ drain extension 308; and channel depletion regions 804, 806 is created in the region between the PG1 gate 320 and the CG gate 322, as well as in the region between the CG gate 322 and the PG2 gate 324 due to the negative charge carriers 808 that are stored in the SiN spacers 326B-326C and the SiN cap 328. Due to the channel depletion regions 804, 806, only a small read current flows through the channel, thus indicating that negative charge carriers are stored in the SiN spacers 326B-326C and the SiN cap 328. The N-FET MNOS MTP device 150 is thus read.

Figure 9:
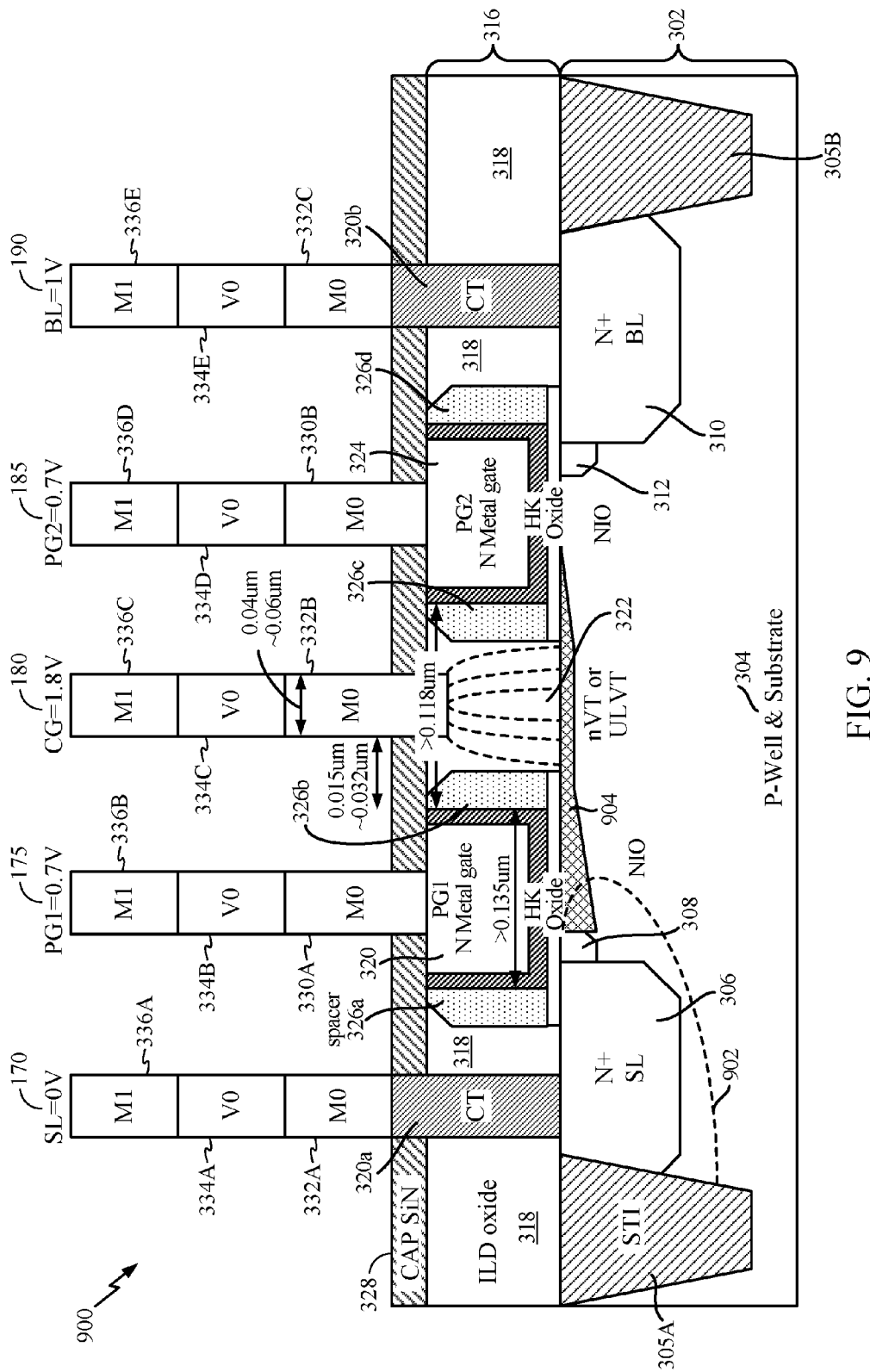
FIG. 9 depicts an exemplary unprogrammed NMOS MTP device during reading.

FIG. 9 depicts the N-FET MNOS MTP device 150 when the N-FET MNOS MTP device 150 is not programmed 900. During reading the N-FET MNOS MTP device 150 when not programmed, the applied AC voltages can be:

$V_{SL}=0V$
$V_{PG1}=+0.7V$
$V_{CG}=+1.8V$
$V_{PG2}=+0.7V$
$V_{BL}=+1V$
$V_{Well}$ (i.e., VB)=0V As a result of this biasing, $V_{CG}>V_{PG1}>V_{SL}$ and $V_{CG}>V_{PG2}<V_{BL}$. A depletion region 902 is created around the N+ drain diffusion 306 and the N+ drain extension 308, and an inversion unbroken channel 904 is created that extends from the N+ drain diffusion 306 toward the N+ source extension 312. Unlike the conditions in FIG. 8, the inversion unbroken channel 904 is not depleted, due to an absence of negative charge carriers in the SiN spacers 326B-326C and the SiN cap 328. Due to the channel being unbroken, a large read current flows through the channel, thus indicating an absence of negative charge carriers being stored in the SiN spacers 326B-326C and the SiN cap 328. The N-FET MNOS MTP device 150 is thus read.

Figure 10:
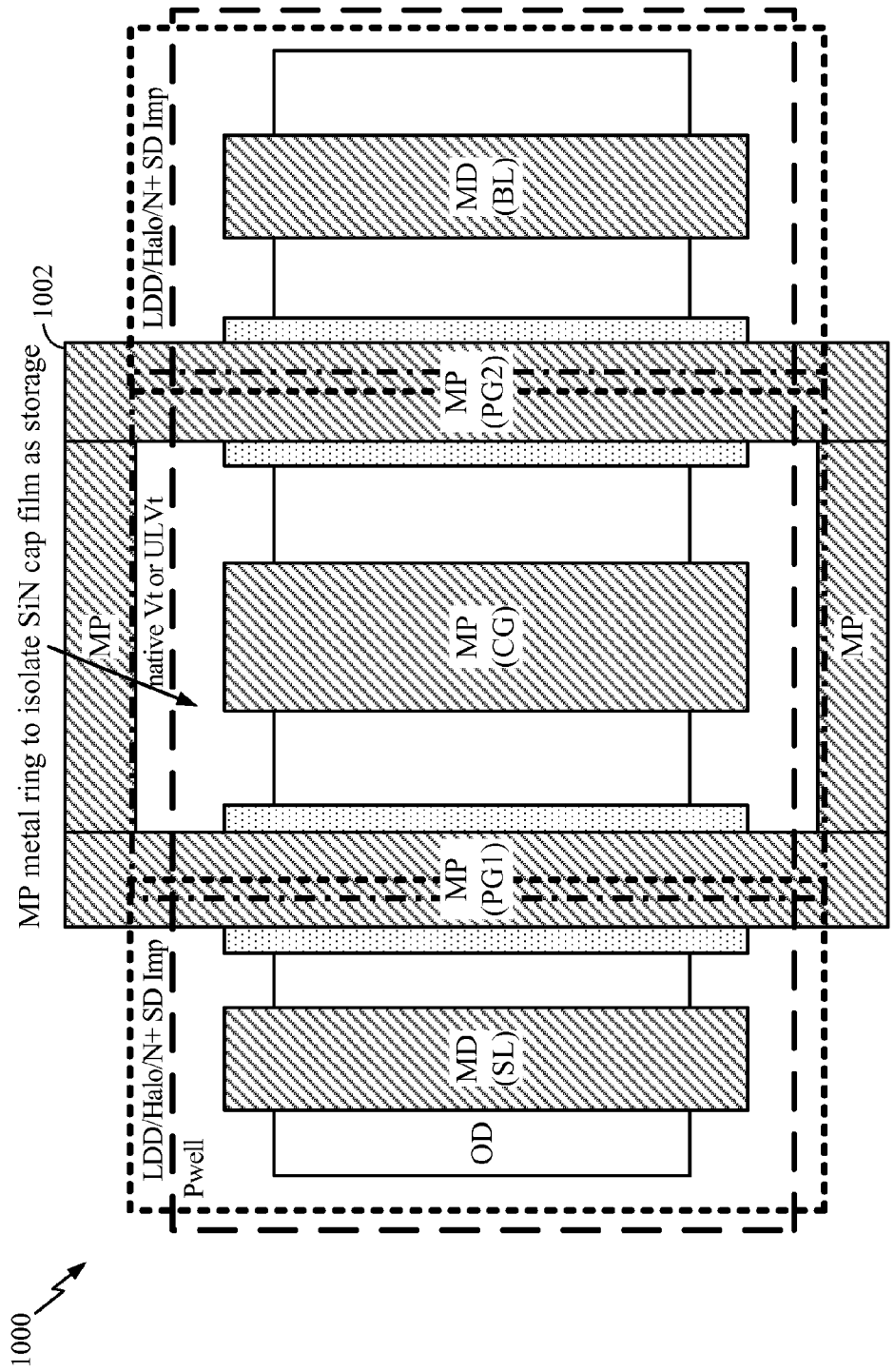
FIG. 10 depicts an exemplary top view of an NMOS MTP device.

FIG. 10 depicts an exemplary top view 1000 of the N-FET MNOS MTP device 150. Shown are the relative positions of the PWell 304, the N+ drain diffusion 306, the PG1 metal gate 320, the CG gate 322, the PG2 metal gate 324, and the N+ source diffusion 310. The SiN cap 328 is also shown, as is a metal ring 1002 configured to isolate the SiN cap 328 and to couple the PG1 metal gate 320 to the PG2 metal gate 324.

Figure 11:
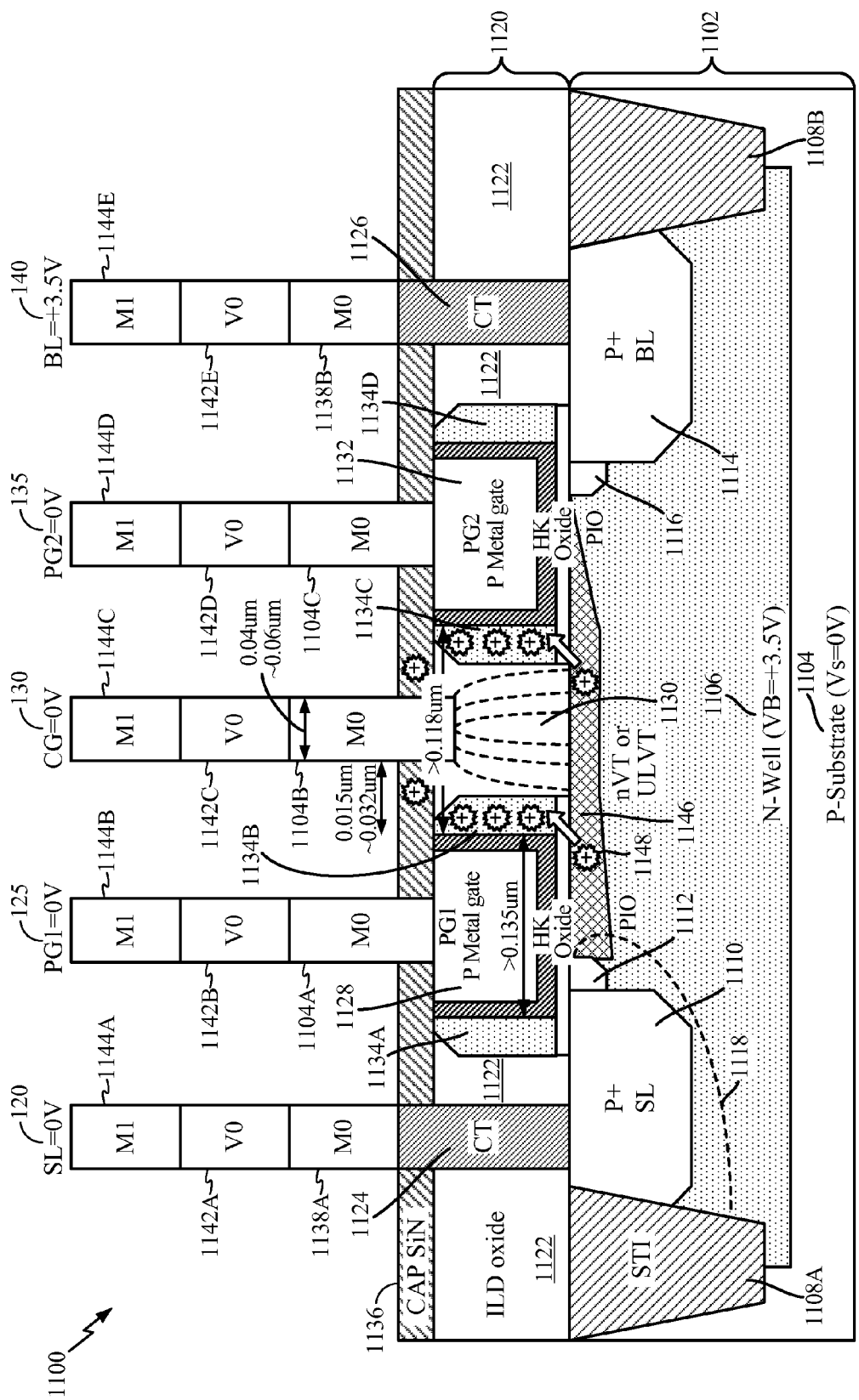
FIG. 11 depicts an exemplary an exemplary PMOS MTP device during programming using channel hot carrier ejection.

FIG. 11 depicts the P-FET MNOS MTP device 100 during programming using channel hot carrier ejection, and provides further detail about an exemplary structure of the P-FET MNOS MTP device 100.

The P-FET MNOS MTP device 100 includes a first layer 1102 including a P-substrate 1104 having an N-well 1106, first and second shallow trench isolation (STI) structures 1108A-1108B on either side of the N-well 1106, a P+ source diffusion 1110 adjacent to the N-well 1106 and that is the SL 120, a P+ source extension 1112 from the P+ source diffusion 1110, a P+ drain diffusion 1114 adjacent to the N-well 1106 and that is the BL 140, and a P+ drain extension 1116 from the P+ drain diffusion 1114. The dashed lines represent a substantial boundary of a depletion region 1118. The boundaries of a depletion region in the P-FET MNOS MTP device 100 can be limited using a halo implant.

A second layer 1120 of the P-FET MNOS MTP device 100 includes an insulating interlayer dielectric oxide (ILD) portion 1122 through which passes a first contact terminal (CT) 1124 of the SL 120 and a second CT 1126 of the BL 140. A portion of the ILD oxide portion 1122 can be configured as a fin. The second layer 1120 also includes three metal gates—a PG1 gate 1128, a CG gate 1130, and a PG2 gate 1132, which are separated by, and adjacent to, SiN spacers 1134A-D. The ILD oxide portion 1122 separates the PG1 gate 1128, the CG gate 1130, and the PG2 gate 1132 from the N-well 1106. The CG gate 1130 can be formed around the fin-shaped portion of the ILD oxide portion 1122.

A SiN cap 1136 is formed on the ILD oxide portion 1122; the SiN spacers 1134B-1134C; the three metal gates—the PG1 gate 1128, the CG gate 1130, and the PG2 gate 1132; and adjacent to the metal lines 1138A-1138B that are respectively coupled to the first CT 1124, the second CT 1126, and metal lines 1140A-1140C that are coupled to the PG1 gate 1128, the CG gate 1130, and the PG2 gate 1132. The SiN cap 1136 can be formed on the fin-shaped portion of the interlayer dielectric (ILD) oxide portion 1122. The SiN spacer portion 1134 and/or the SiN cap 1136 can be used as a charge carrier storage layer.

The metal lines 1140A-1140C coupled to the PG1 gate 1128, the CG gate 1130, and the PG2 gate 1132 can optionally be coupled to a respective vertical interconnect access ("via0") 1142A-1142E and/or an additional layer (M1) of metal lines 1144A-E.

During the programming of the P-FET MNOS MTP device 100 using channel hot carrier ejection (CHE) 1100, the applied AC voltages can be:

$V_{SL}=0V$
$V_{PG1}=0V$
$V_{CG}=0$
$V_{PG2}=0V$
$V_{BL}=+3.5V$
$V_{Well}$ (i.e., VB)=+3.5V As a result of this biasing, a channel 1146 extends from the P+ source diffusion 1110 toward the P+ drain extension 1116 due to $V_{BL}>V_{SL}$. Also, $V_{Well}>V_{CG}$, thus, positive charge carriers 1148 (i.e., hot holes) are drawn from the P channel and P+ source diffusion 1110, the P+ source extension 1112, and the channel 1146 toward the CG gate 1130 through the SiN spacers 1134B-1134C and the SiN cap 1136. When applied voltages are removed, the positive charge carriers 1148 remain stored in the SiN spacers 1134B-1134C and the SiN cap 1136, and the P-FET MNOS MTP device 100 is programmed.

Figure 12:
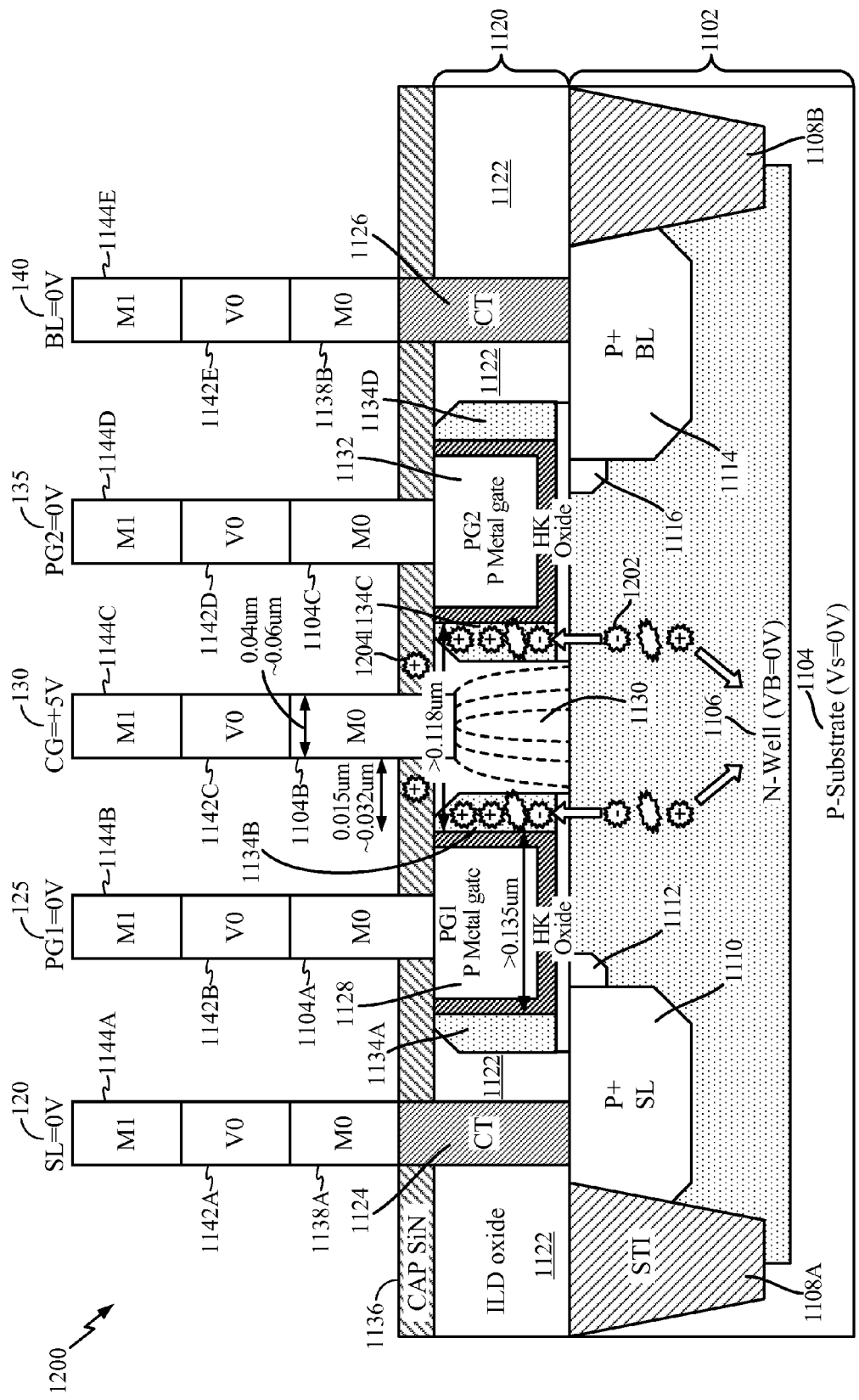
FIG. 12 depicts an exemplary PMOS MTP device during erasing using Fowler-Nordheim tunneling.

FIG. 12 depicts the P-FET MNOS MTP device 100 during erasing using Fowler-Nordheim tunneling 1200. During erasing using channel electron Fowler-Nordheim tunneling, the applied AC voltages can be:

$V_{SL}=0V$
$V_{PG1}=0V$
$V_{CG}=+5V$
$V_{PG2}=0V$
$V_{BL}=0V$
$V_{Well}$ (i.e., VB)=0V As a result of this biasing, $V_{CG}>>>V_{Well}$. No channel is formed because $V_{SL}=V_{PG1}=V_{PG2}=V_{BL}=0V$. However, due to the high electric field between $V_{CG}$ and $V_{Well}$, Fowler-Nordheim tunneling occurs, and negative charge carriers 1202 are drawn from the N-Well 1106 to the SiN spacers 1134B-1134C and the SiN cap 1136. The negative charge carriers 1202 are drawn toward the metal line 1140B that is coupled to the CG gate 1130, and combine with positive charge carriers 1204 (i.e. holes) stored in the SiN spacers 1134B-1134C and the SiN cap 1136. When applied voltages are removed, the positive charge carriers 1204 are no longer remain stored in the SiN spacers 1134B-1134C and the SiN cap 1136, and the P-FET MNOS MTP device 100 is thus erased using channel electron Fowler-Nordheim tunneling.

Figure 13:
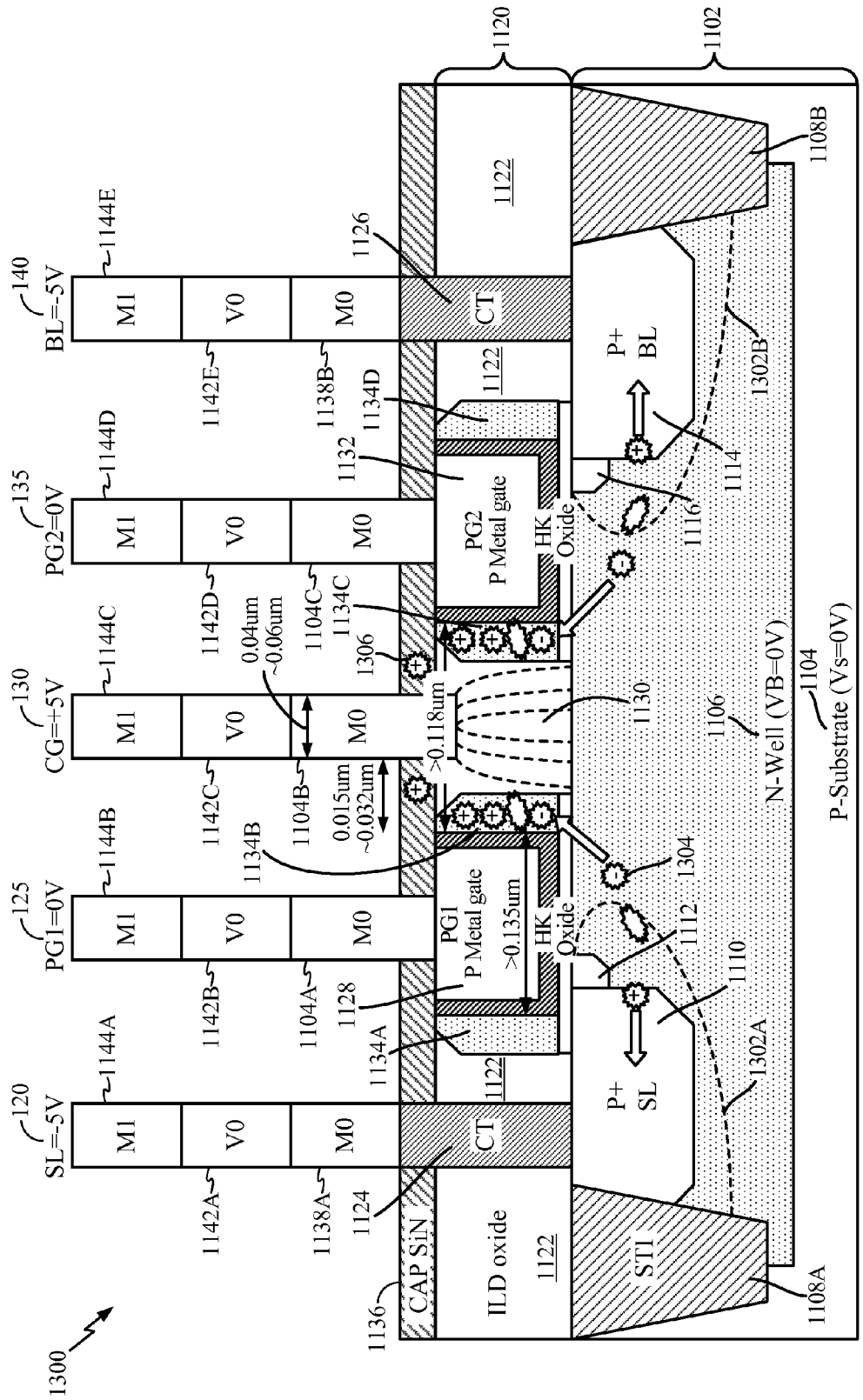
FIG. 13 depicts an exemplary PMOS MTP device during erasing using hot electron injection.

FIG. 13 depicts the P-FET MNOS MTP device 100 during erasing using hot electron injection 1300. During erasing of the P-FET MNOS MTP device 100 using hot electron injection, the applied DC voltages can be:

$V_{SL}=-5V$
$V_{PG1}=0V$
$V_{CG}=+5V$
$V_{PG2}0V$
$V_{BL}=-5V$
$V_{Well}$ (i.e., VB)=0V As a result of this biasing, depletion regions 1302A-1302B are created around the P+ source diffusion 1110 and the P+ source extension 1112, as well as around the P+ drain diffusion 1114 and the P+ drain extension 1116 due to $V_{SL}<<<V_{PG1}<<<V_{CG}$ and $V_{BL}<<<V_{PG2}<<<V_{CG}$. Thus, negative charge carriers 1304 (i.e., electrons) are drawn from the depletion regions 1302A-1302B toward the CG gate 1130 through the SiN spacers 1134B-1134C and the SiN cap 1136. The negative charge carriers 1304 combine with stored positive charge carriers 1306 (i.e., the electrons return to a valence band from a conduction band) in the SiN spacers 1134B-1134C and the SiN cap 1136 to remove the positive charge carriers 1306 stored in the SiN spacers 1134B-1134C and the SiN cap 1136. When applied voltages are removed, the positive charge carriers 1306 no longer remain stored in the SiN spacers 1134B-1134C and the SiN cap 1136, and the P-FET MNOS MTP device 100 is thus erased using channel hot electron injection.

Figure 14:
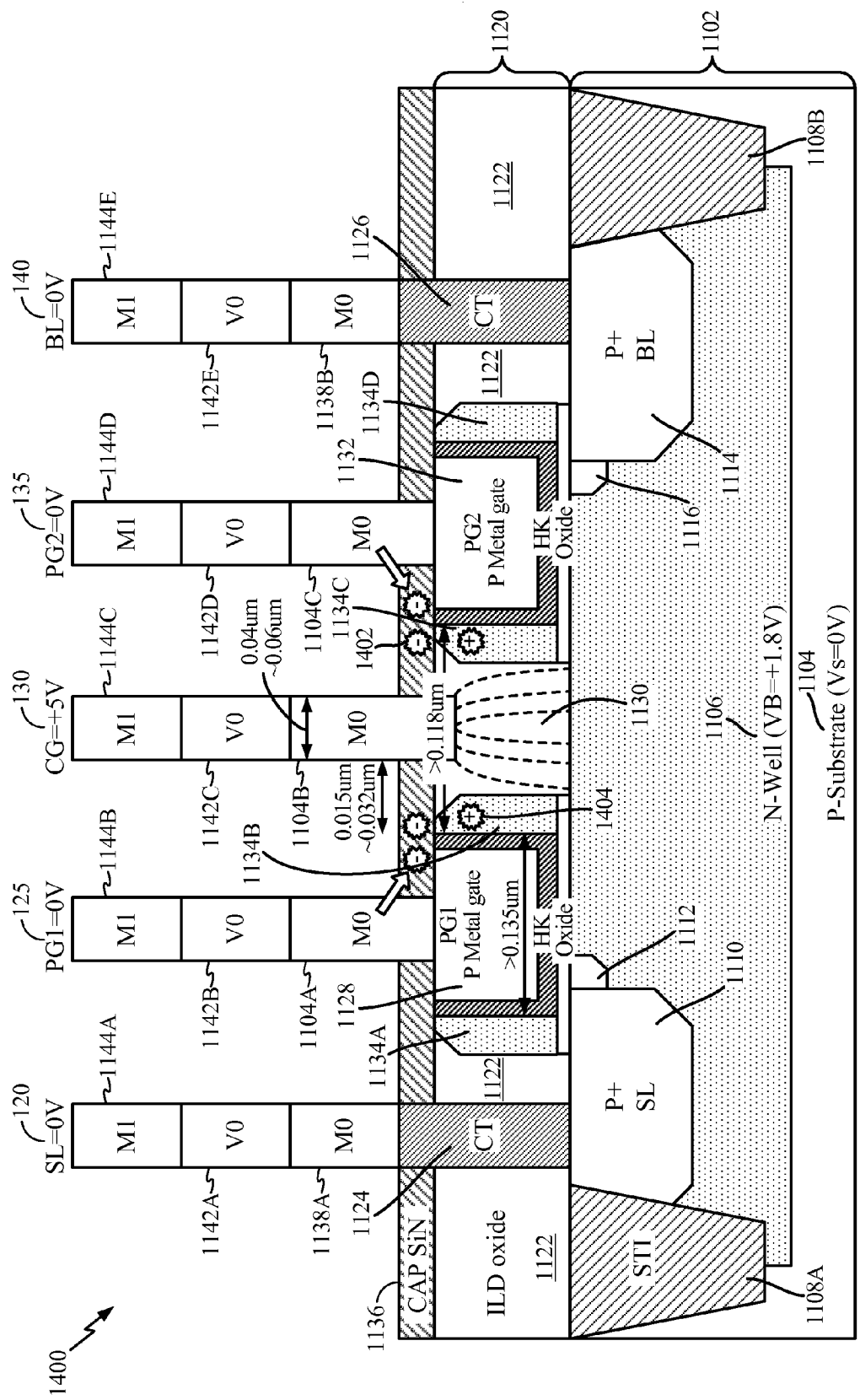
FIG. 14 depicts an exemplary PMOS MTP device during erasing using top electron Fowler-Nordheim tunneling.

FIG. 14 depicts the P-FET MNOS MTP device 100 during erasing using top electron Fowler-Nordheim tunneling 1400. During erasing using top electron Fowler-Nordheim tunneling, the applied AC voltages can be:

$V_{SL}$=0V
$V_{PG1}$=0V
$V_{CG}$=−5V
$V_{PG2}$=0V
$V_{BL}$=0V
$V_{Well}$ (i.e., VB)=+1.8V As a result of this biasing, $V_{SL}$=$V_{PG1}$<<<$V_{CG}$ and $V_{BL}$=$V_{PG2}$<<<$V_{CG}$. Also, $V_{Well}$<<<$V_{CG}$. Due to the high electric field between the CG gate 1130 and the PG1 metal gate 1128, as well as the high electric field between the CG gate 1130 and the PG2 metal gate 1132, Fowler-Nordheim tunneling occurs, and negative charge carriers 1402 are emitted from the metal line 1140A that is coupled to the PG1 metal gate 1128 and are emitted from the metal line 1140C that is coupled to the PG2 metal gate 1132. The negative charge carriers 1402 are drawn toward the SiN spacers 1134B-1134C and the SiN cap 1136. The negative charge carriers 1402 combine with stored positive charge carriers 1404 (i.e., the electrons return to a valence band from a conduction band) from the SiN spacers 1134B-1134C and the SiN cap 1136 to remove the positive charge carriers 1404 stored in the SiN spacers 1134B-1134C and the SiN cap 1136. When applied voltages are removed, the positive charge carriers 1404 no longer remain stored in the SiN spacers 1134B-1134C and the SiN cap 1136, and the P-FET MNOS MTP device 100 is thus erased using top electron Fowler-Nordheim tunneling.

Figure 15:
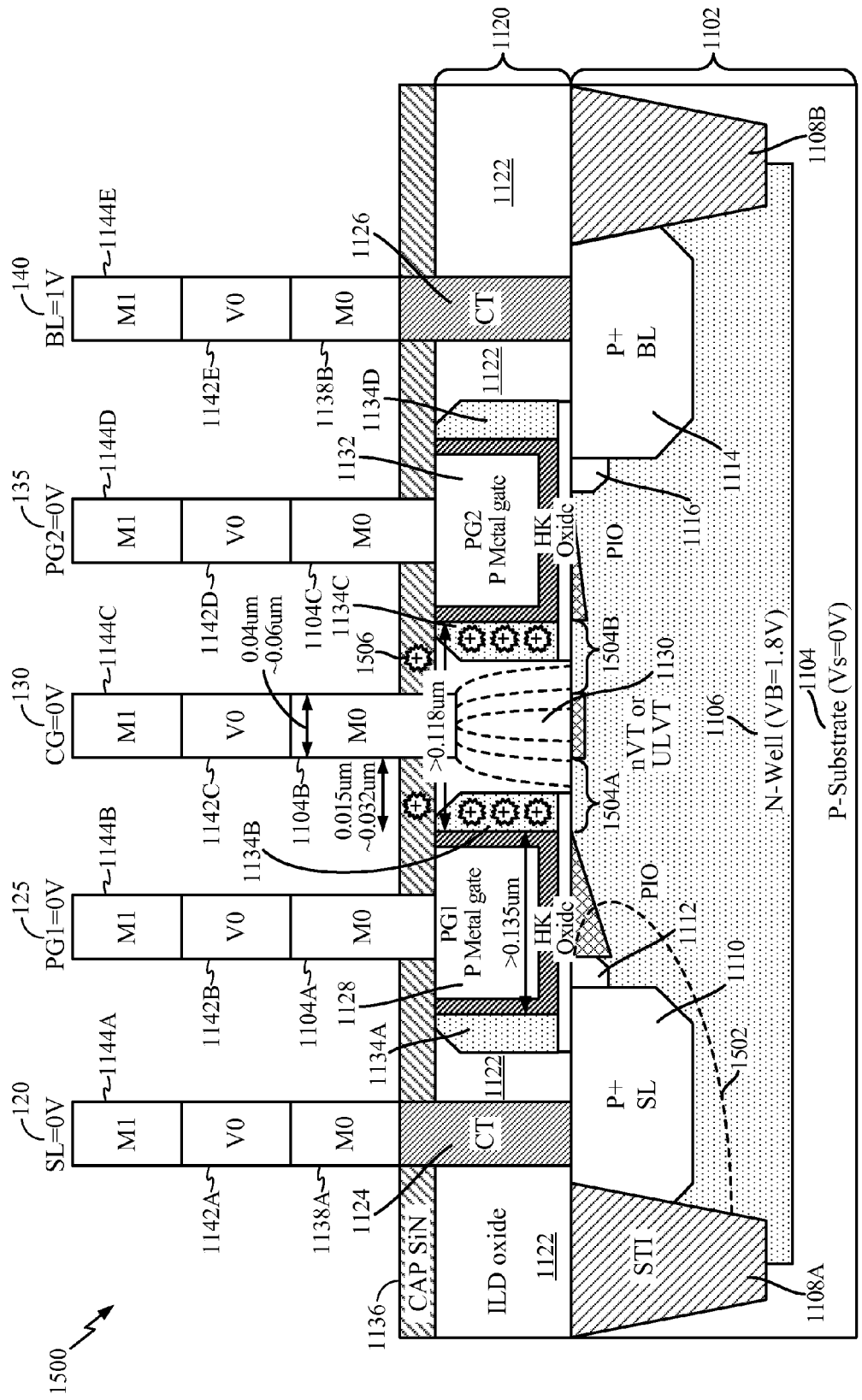
FIG. 15 depicts an exemplary programmed PMOS MTP device during reading.

FIG. 15 depicts the P-FET MNOS MTP device 100 in a programmed state. During reading the P-FET MNOS MTP device 100 when programmed 1500, the applied AC voltages can be:

$V_{SL}$=0V
$V_{PG1}$=0V
$V_{CG}$=0V
$V_{PG2}$=0V
$V_{BL}$=+1V
$V_{Well}$ (i.e., VB)=+1.8V As a result of this biasing, $V_{CG}$=$V_{PG1}$=$V_{PG2}$=$V_{SL}$, $V_{Well}$>$V_{SL}$,$V_{Well}$>$V_{PG1}$, $V_{Well}$>$V_{CG}$, and $V_{Well}$>$V_{BL}$. A depletion region 1502 is created around the P+ source diffusion 1110 and the P+ source extension 1112; and channel depletion regions 1504A-1504B are created in the region between the PG1 gate 1128 and the CG gate 1130, as well as in the region between the CG gate 1130 and the PG2 gate 1132 due to positive charge carriers 1506 that are stored in the SiN spacers 1134B-1134C and the SiN cap 1136. Due to the channel depletion regions 1504A-1504B, only a small read current flows through the channel, thus indicating that the positive charge carriers 1506 are stored in the SiN spacers A1134B-1134C and the SiN cap 1136. The P-FET MNOS MTP device 100 is thus read.

Figure 16:
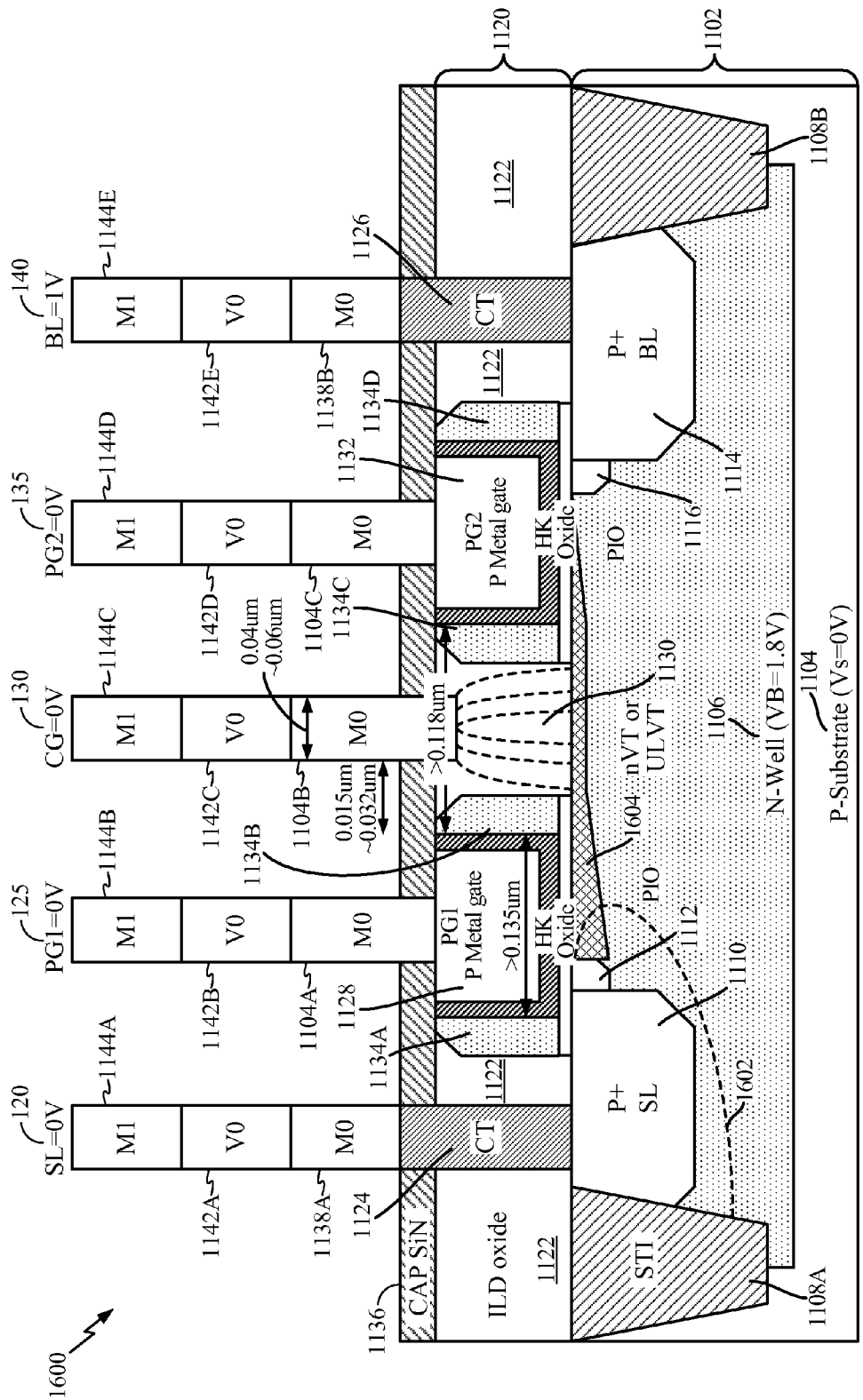
FIG. 16 depicts an exemplary unprogrammed PMOS MTP device during reading.

FIG. 16 depicts the P-FET MNOS MTP device 100 in an unprogrammed state. During reading the P-FET MNOS MTP device 100 when not programmed 1600, the applied AC voltages can be:

$V_{SL}$=0V
$V_{PG1}$=0V
$V_{CG}$=0V
$V_{PG2}$=0V
$V_{BL}$=+1V
$V_{Well}$ (i.e., VB)=+1.8V As a result of this biasing, $V_{Well}$>$V_{BL}$>VSL=VPG1=$V_{CG}$=$V_{PG2}$. A depletion region 1602 is created around the P+ source diffusion 1110 and the P+ source extension 1112, and an unbroken channel 1604 is created that extends from the P+ source diffusion 1110 toward the P+ drain extension 1116. Unlike the conditions in FIG. 15, the unbroken channel 1604 is not depleted, due to an absence of positive charge carriers in the SiN spacers 1134B-1134C and the SiN cap 1136. Due to the unbroken channel 1604 being unbroken, a large read current flows through the unbroken channel 1604, thus indicating an absence of positive charge carriers being stored in the SiN spacers 1134B-1134C and the SiN cap 1136. The P-FET MNOS MTP device 100 is thus read.

Figure 17:
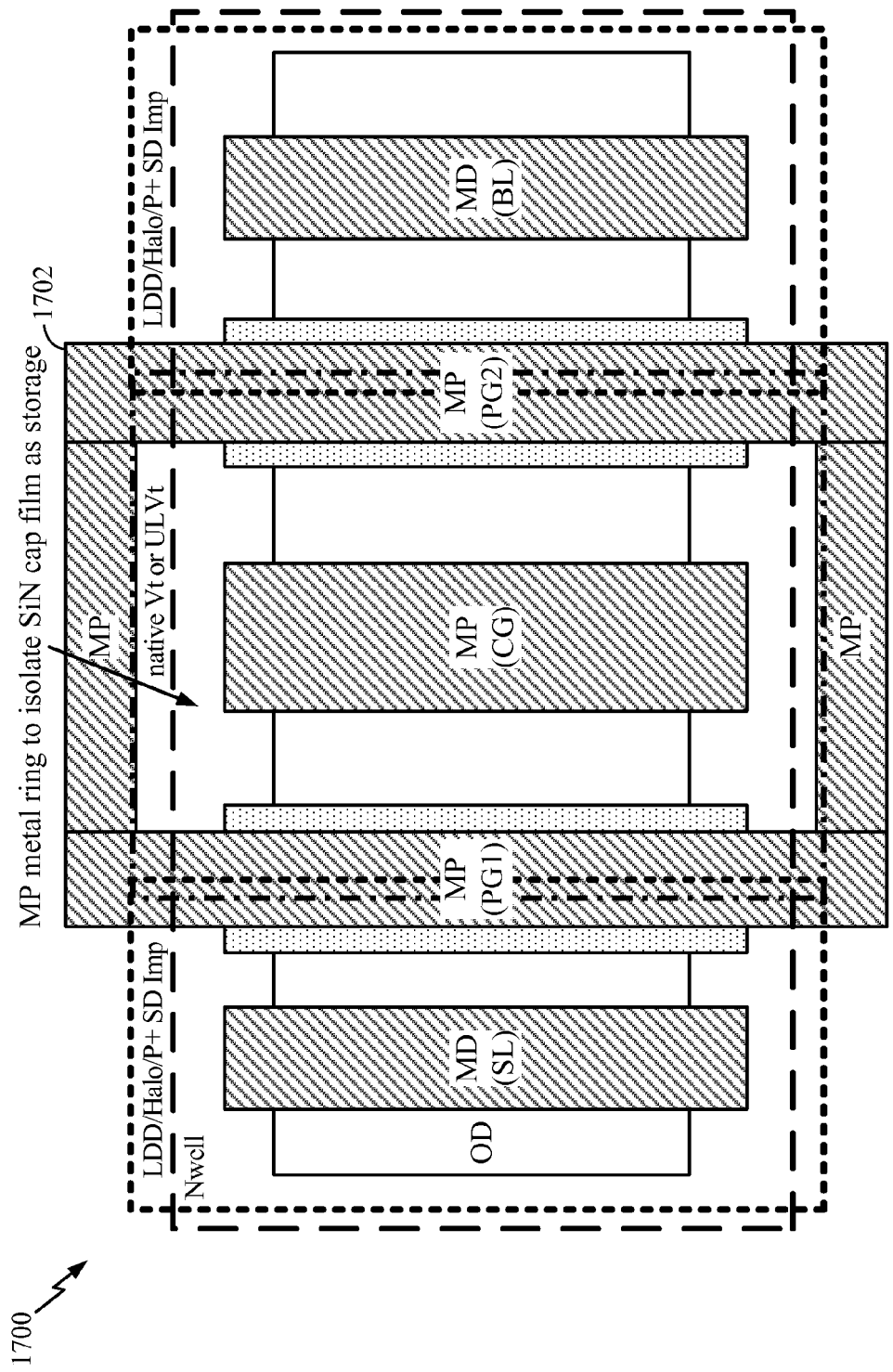
FIG. 17 depicts an exemplary top view of a PMOS MTP device.

FIG. 17 depicts an exemplary top view 1700 of the P-FET MNOS MTP device 100. Shown are the relative positions of the NWell 1106, the P+ source diffusion 1110, the PG1 metal gate 1128, the CG gate 1130, the PG2 metal gate 1132, and the P+ drain diffusion 1114. The SiN cap 1136 is also shown, as is a metal ring 1702 configured to isolate the SiN cap 1136 and to couple the PG1 metal gate 1128 to the PG2 metal gate 1132.

Figure 18:
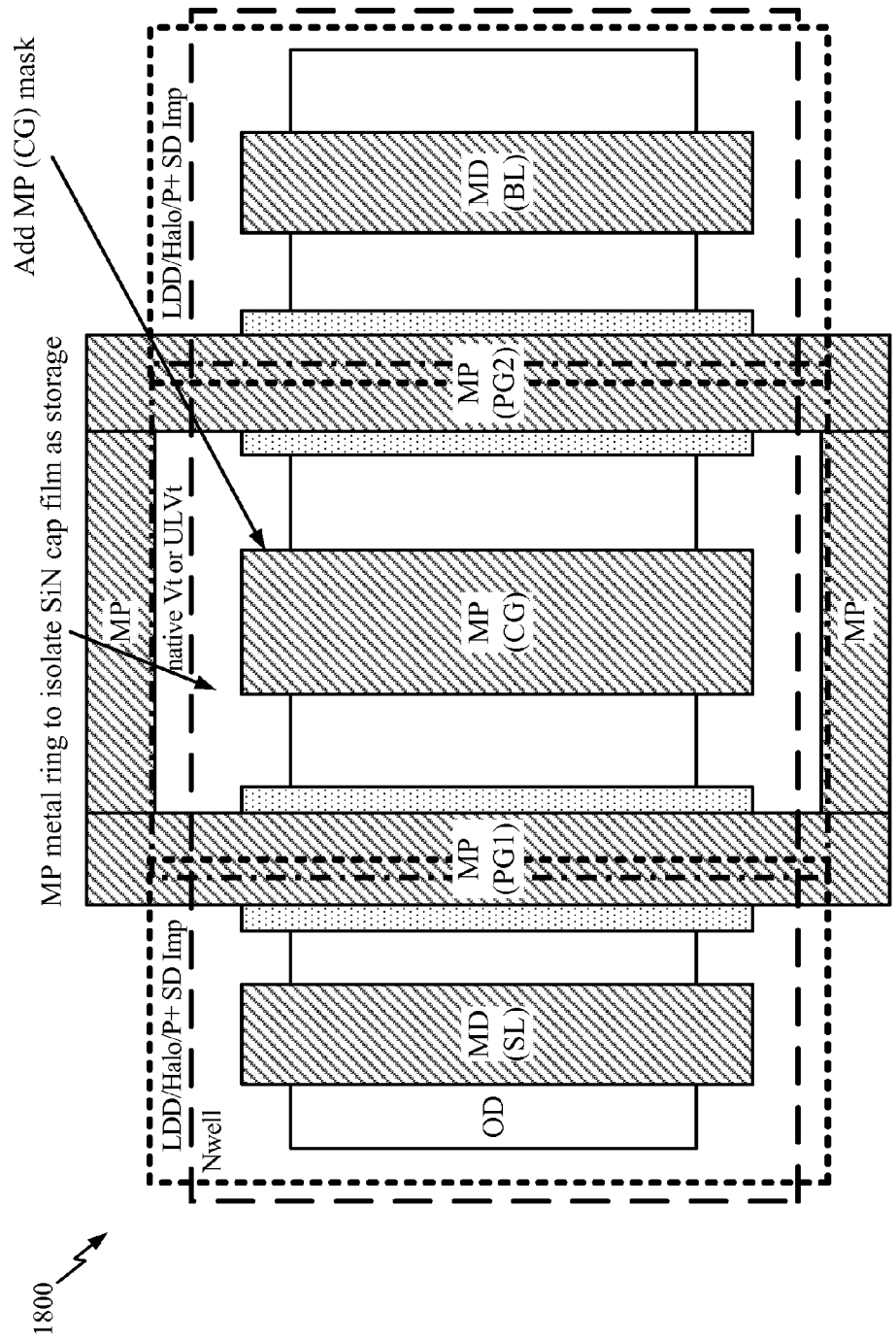
FIG. 18 depicts an exemplary top view of a PMOS MTP device having a control gate with a precise depth.

FIG. 18 depicts an exemplary top view 1800 of the P-FET MNOS MTP device 100 having a control gate with a precise depth. If SiN/oxide selectivity needs to be increased, the CG gate 1130 can be formed to a more precise depth by adding, during forming the CG gate 1130, an additional mask, an additional deposition step, and an additional etching step to precisely control a depth of the CG gate 1130.

Figure 19:
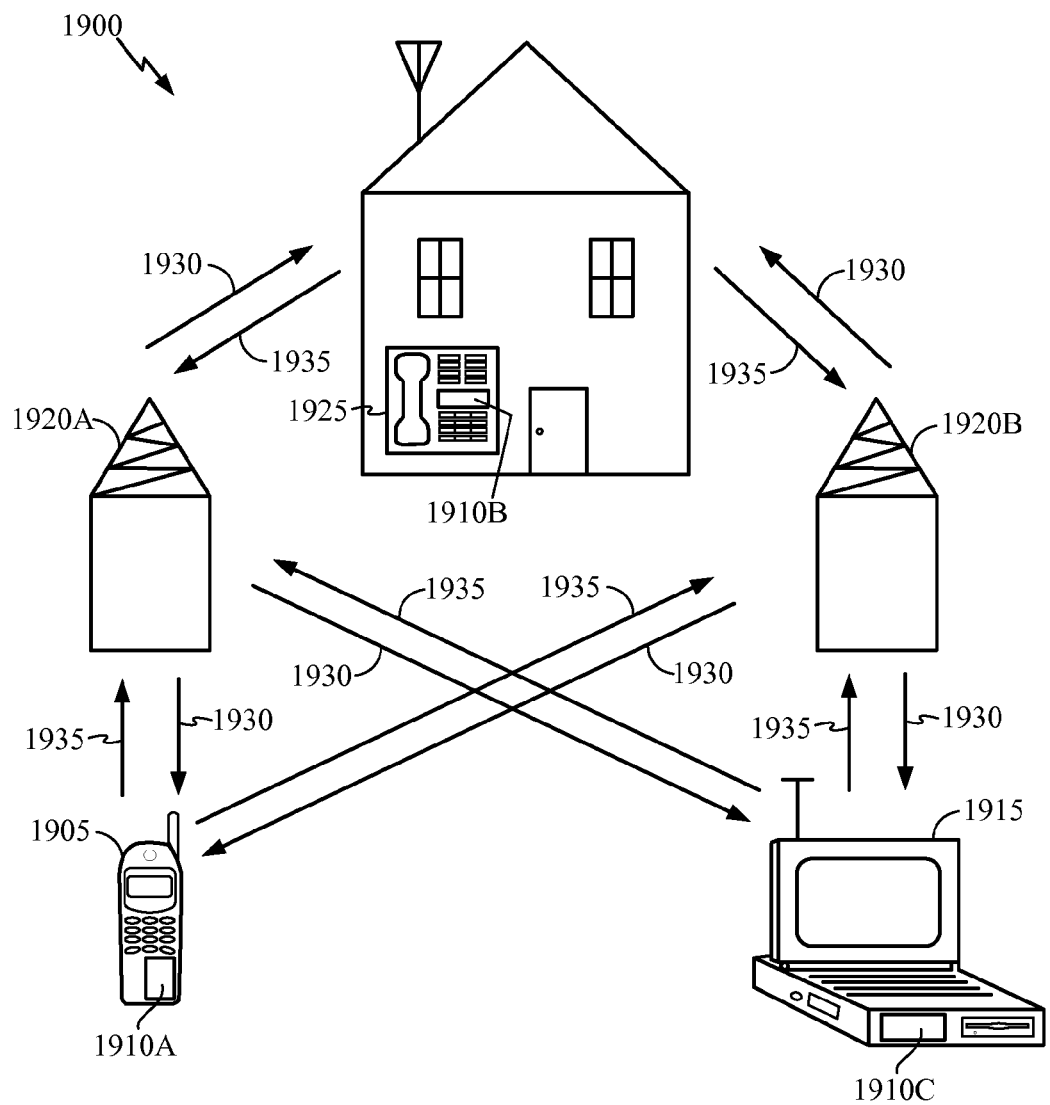
FIG. 19 depicts an exemplary communication system.

FIG. 19 depicts an exemplary communication system 1900 in which an embodiment of the disclosure can be advantageously employed. For purposes of illustration, FIG. 19 shows three remote units 1905, 1915, and 1925 and two base stations 1920A-B. The communication system 1900 can have more or fewer remote units and more or fewer base stations. The remote units 1905, 1915, and 1925 include at least a part of an embodiment 1910A-C of the disclosure as discussed further herein. FIG. 19 also shows forward link signals 1930 from the base stations 1920A-B and the remote units 1905, 1915, and 1925, as well as reverse link signals 1935 from the remote units 1905, 1915, and 1925 to the base stations 1920A-B.

In FIG. 19, the remote unit 1905 is shown as a mobile telephone, the remote unit 1915 is shown as a portable computer, and the remote unit 1925 is shown as a fixed location remote unit in a wireless local loop system. In examples, the remote units 1915 can be a mobile device, a mobile phone, a hand-held personal communication systems (PCS) unit, a portable data unit such as a personal data assistant, a GPS-enabled device, a navigation device, a set top box, a music player, a mobile device, a video player, an entertainment unit, or any other device that stores or retrieves data or computer instructions, or any combination thereof. Although FIG. 19 depicts remote units according to the teachings of the disclosure, the disclosure is not limited to these exemplary remote units. Embodiments of the disclosure can be suitably employed in any device which includes MRAM memory.

Figure 20:
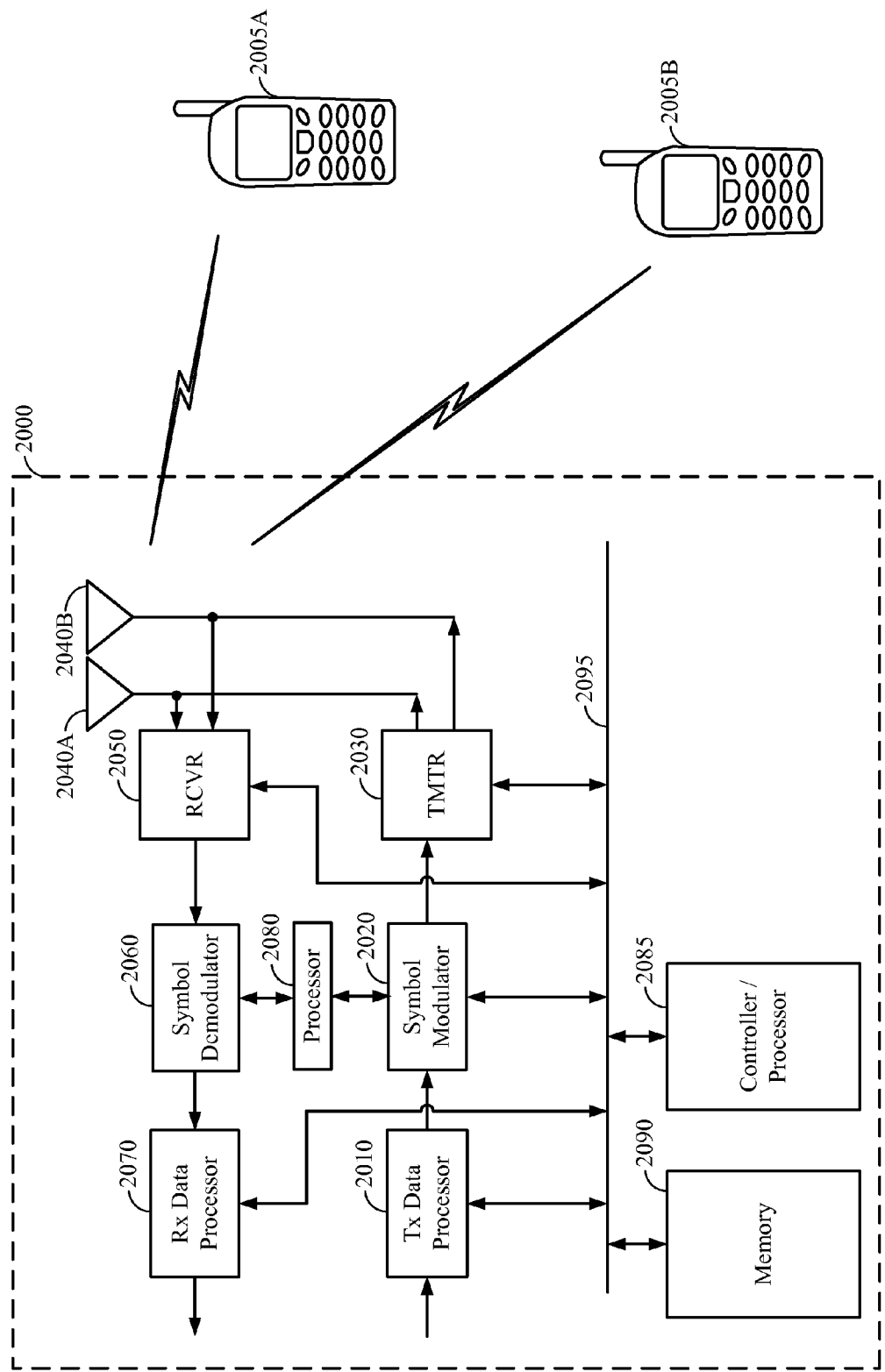
FIG. 20 depicts an exemplary access point.

FIG. 20 depicts an exemplary access point (AP) 2000. The access point 2000 can be, for example, any of the base stations 1920A-B. As shown, the access point 2000 includes a TX data processor 2010, symbol modulator 2020, transmitter unit (TMTR) 2030, one or more antennas (e.g., antennas 2040A-B), receiver unit (RCVR) 2050, symbol demodulator 2060, RX data processor 2070, and configuration information processor 2080, performing various operations to communicate with one or more mobile devices (e.g., user devices 2005A-B). The access point 2000 can also include one or more controllers and/or processors (illustrated in the singular as the controller/processor 2085) and a memory 2090 configured to store related data or instructions. Together, via a bus 2095, these units can perform processing in accordance with an appropriate radio technology or technologies used for communication, as well as other functions for the access point 2000. The exemplary P-FET MNOS MTP device 100 and/or the exemplary N-FET MNOS MTP device 150 can be a part of a circuit within, and/or coupled to, a portion of the access point 2000, such as the TX data processor 2010, the symbol modulator 2020, the transmitter unit (TMTR) 2030, the receiver unit (RCVR) 2050, the symbol demodulator 2060, the RX data processor 2070, and/or the configuration information processor 2080 and/or the controller/processor 2085. In an example, any of the base stations 1920A-B and/or the access point 2000 is configured to perform at least a part of a method described hereby.

The access point 2000 can provide a wireless local area network (WLAN) air interface (e.g., in accordance with an IEEE 802.11x protocol), and/or a cellular air interface (e.g., in accordance with an LTE protocol). The access point 2000 can communicate with a user device (e.g., user devices 2005A-B), and a user device (e.g., user devices 2005A-B) can communicate with the access point 2000. In general, the access point 2000 can provide an air interface (e.g., in accordance with an IEEE 802.11x protocol) over an unlicensed portion of the wireless spectrum such as an industrial, scientific, and medical (ISM) radio band, and/or can provide an air interface (e.g., in accordance with an LTE protocol) over a licensed portion of the wireless band reserved for cellular communications. The access point 2000 can also be configured to provide cellular (e.g., LTE) connectivity over an unlicensed portion of the wireless spectrum. This type of unlicensed cellular operation can include the use of an anchor licensed carrier operating in a licensed portion of the wireless spectrum (e.g., LTE Supplemental DownLink (SDL)) and an unlicensed portion of the wireless spectrum (e.g., LTE-Unlicensed), or can be a standalone configuration operating without using an anchor licensed carrier (e.g., LTE Standalone).

Figure 21:
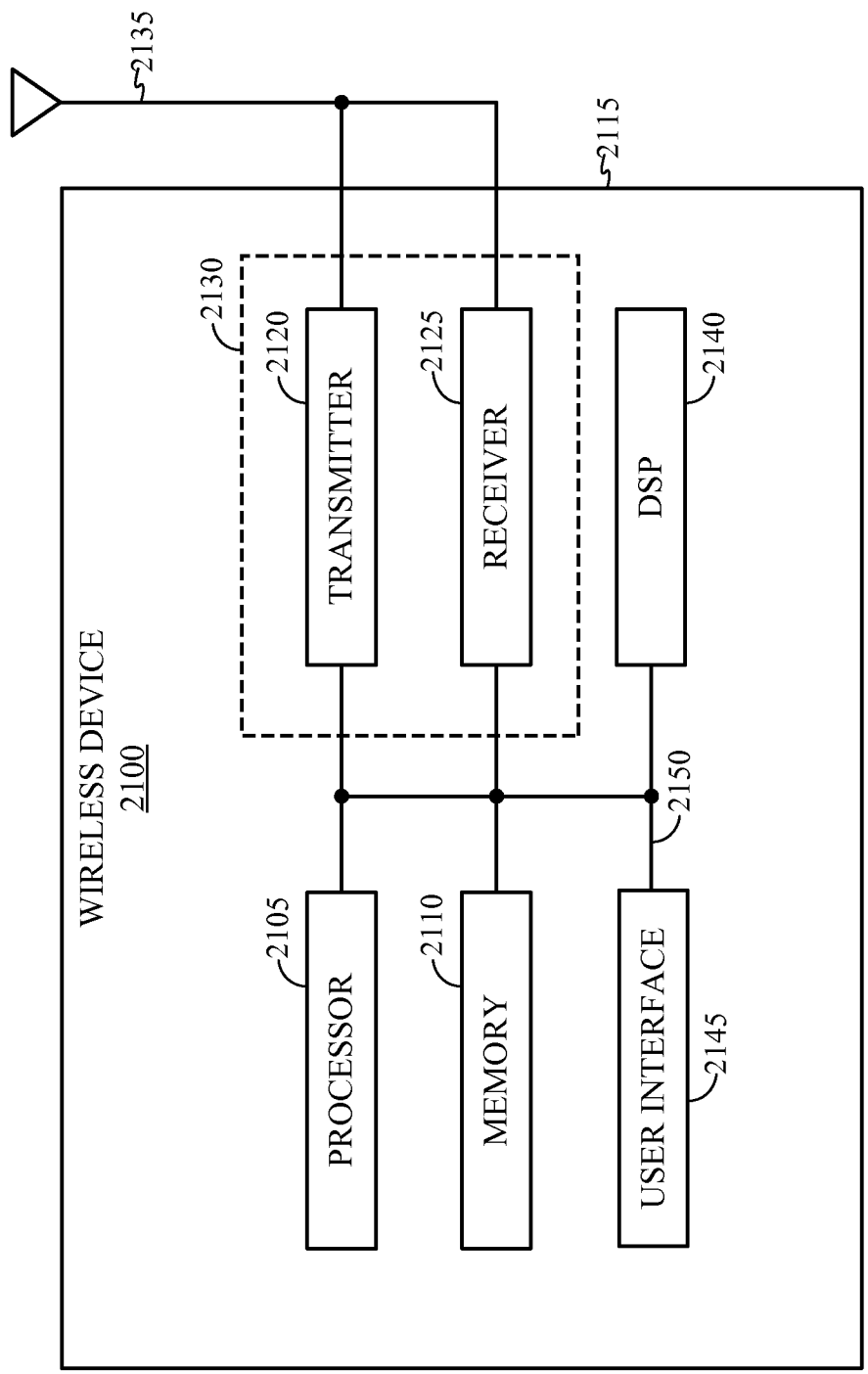
FIG. 21 depicts a functional block diagram of an exemplary wireless device.

FIG. 21 illustrates various components that can be utilized in a wireless device 2100 (e.g., a mobile device) that can be employed within the communication system 1900. The wireless device 2100 is an example of a device that can be configured to include the apparatus described herein. The wireless device 2100 can be, for example, any of three remote units 1905, 1915, and 1925. The wireless device 2100 can be a mobile device, such as a user device (e.g., user devices 2005A-B).

The wireless device 2100 can include a processor 2105 which controls operation of the wireless device 2100. The processor 2105 can also be referred to as a central processing unit (CPU). A memory 2110, which can include both read-only memory (ROM) and random access memory (RAM) (e.g., the P-FET MNOS MTP device 100 and/or the exemplary N-FET MNOS MTP device 150), provides instructions and data to the processor 2105. A portion of the memory 2110 can also include non-volatile random access memory (NVRAM). The processor 2105 performs logical and arithmetic operations based on program instructions stored within the memory 2110. The instructions in the memory 2110 can be executable to implement the methods described herein.

The processor 2105 can comprise or be a component of a processing system implemented with one or more processors. The one or more processors can be implemented with a microprocessor, a microcontroller, a digital signal processor (DSP), a field programmable gate array (FPGA), a programmable logic device (PLD), a controller, a state machine, gated logic, a discrete hardware component, a dedicated hardware finite state machine, and/or any other suitable entity that can calculate and/or manipulate information.

The processing system can also include a non-transitory machine-readable media that stores software. Software can mean any type of instructions, whether referred to as software, firmware, middleware, microcode, hardware description language, and/or otherwise. Instructions can include code (e.g., in source code format, binary code format, executable code format, or any other suitable format of code). The instructions, when executed by the one or more processors, can transform the processor (e.g., the processor 2105) into a special-purpose processor that cause the processor to perform a function described herein.

The wireless device 2100 can also include a housing 2115, a transmitter 2120, and a receiver 2125 to allow transmission and reception of data between the wireless device 2100 and a remote location. The transmitter 2120 and receiver 2125 can be combined into a transceiver 2130. An antenna 2135 can be attached to the housing 2115 and electrically coupled to the transceiver 2130. The wireless device 2100 can also include (not shown) multiple transmitters, multiple receivers, multiple transceivers, and/or multiple antennas.

The wireless device 2100 can further comprise a digital signal processor (DSP) 2140 that is configured to process data. The wireless device 2100 can also further comprise a user interface 2145. The user interface 2145 can comprise a keypad, a microphone, a speaker, and/or a display. The user interface 2145 can include any element and/or component that conveys information to a user of the wireless device 2100 and/or receives input from the user.

The various components of the wireless device 2100 can be coupled together by a bus system 2150. The bus system 2150 can include a data bus, for example, as well as a power bus, a control signal bus, and/or a status signal bus in addition to the data bus. Those of skill in the art will appreciate the components of the wireless device 2100 can be coupled together to accept or provide inputs to each other using some other mechanism.

The exemplary P-FET MNOS MTP device 100 and/or the exemplary N-FET MNOS MTP device 150 can be a part of a circuit within, and/or coupled to, a portion of the wireless device 2100, such as the processor 2105, the memory 2110, the transmitter 2120, the receiver 2125, and/or the DSP 2140. In an example, any of the base stations 1920A-B and/or the wireless device 2100 is configured to perform at least a part of a method described hereby.

Although a number of separate components are illustrated in FIG. 21, those of skill in the art will recognize that one or more of the components can be combined or commonly implemented. For example, the processor 2105 can be used to implement not only the functionality described above with respect to the processor 2105, but also to implement the functionality described above with respect to the DSP 2140. Further, each of the components illustrated in FIG. 21 can be implemented using a plurality of separate elements.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

In some aspects, the teachings herein can be employed in a multiple-access system capable of supporting communication with multiple users by sharing the available system resources (e.g., by specifying one or more of bandwidth, transmit power, coding, interleaving, and so on). For example, the teachings herein can be applied to any one or combinations of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein can be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Re199, Re15, Re16, Re17) technology, as well as 3GPP2 (e.g., 1×RTT, 1×EV-DO RelO, RevA, RevB) technology and other technologies. The techniques can be used in emerging and future networks and interfaces, including Long Term Evolution (LTE).

At least a portion of the methods, sequences, and/or algorithms described in connection with the embodiments disclosed herein can be embodied directly in hardware, in software executed by a processor, or in a combination of the two. In an example, a processor includes multiple discrete hardware components. A software module may reside in RAM memory, flash memory, ROM memory, EPROM memory, EEPROM memory, registers, hard disk, a removable disk, a CD-ROM, and/or any other form of storage medium known in the art. An exemplary storage medium (e.g., a memory) can be coupled to the processor such that the processor can read information from, and write information to, the storage medium. In an alternative, the storage medium may be integral with the processor.

Further, many embodiments are described in terms of sequences of actions to be performed by, for example, elements of a computing device. The actions described herein can be performed by a specific circuit (e.g., an application specific integrated circuit (ASIC)), by program instructions being executed by one or more processors, or by a combination of both. Additionally, a sequence of actions described herein can be considered to be embodied entirely within any form of computer readable storage medium having stored therein a corresponding set of computer instructions that upon execution would cause an associated processor (such as a special-purpose processor) to perform at least a portion of a function described herein. Thus, the various aspects of the invention may be embodied in a number of different forms, all of which have been contemplated to be within the scope of the claimed subject matter. In addition, for each of the embodiments described herein, a corresponding circuit of any such embodiments may be described herein as, for example, "logic configured to" perform a described action.

An embodiment of the invention can include a computer readable media embodying a method described herein. Accordingly, the invention is not limited to illustrated examples and any means for performing the functions described herein are included in embodiments of the invention.

The disclosed devices and methods can be designed and can be configured into a computer-executable file that is in a Graphic Database System Two (GDSII) compatible format, an Open Artwork System Interchange Standard (OASIS) compatible format, and/or a GERBER (e.g., RS-274D, RS-274X, etc.) compatible format, which are stored on a non-transitory (i.e., a non-transient) computer-readable media. The file can be provided to a fabrication handler who fabricates with a lithographic device, based on the file, an integrated device. Deposition of a material to form at least a portion of a structure described herein can be performed using deposition techniques such as physical vapor deposition (PVD, e.g., sputtering), plasma-enhanced chemical vapor deposition (PECVD), thermal chemical vapor deposition (thermal CVD), and/or spin-coating. Etching of a material to form at least a portion of a structure described herein can be performed using etching techniques such as plasma etching. In an example, the integrated device is on a semiconductor wafer. The semiconductor wafer can be cut into a semiconductor die and packaged into a semiconductor chip. The semiconductor chip can be employed in a device described herein (e.g., a mobile device).

Nothing stated or illustrated depicted in this application is intended to dedicate any component, step, feature, object, benefit, advantage, or equivalent to the public, regardless of whether the component, step, feature, object, benefit, advantage, or the equivalent is recited in the claims.

While this disclosure describes exemplary embodiments of the invention, it should be noted that various changes and modifications could be made herein without departing from the scope of the invention as defined by the appended claims.

What is claimed is:

1. An apparatus, comprising:
 a two-gate field effect transistor (2T field FET) metal-nitride-oxide-silicon (MNOS) multi-time programmable (MTP) memory, including:
  a substrate;
  a first transistor formed on the substrate, wherein the first transistor includes a first metal gate coupled to a word line;
  a second transistor formed on the substrate, wherein the second transistor includes a second metal gate coupled to the word line;
  a fin-shaped interlayer dielectric (ILD) oxide region that is formed on a well of the substrate and separates the first metal gate and the second metal gate from the well;
  a metal control gate, wherein the metal control gate is formed around the fin-shaped ILD oxide region and between the first metal gate of the first transistor and the second metal gate of the second transistor;
  a silicon nitride cap formed on the fin-shaped ILD oxide region;
  a first silicon nitride spacer formed between the first metal gate of the first transistor and the metal control gate to separate the first metal gate of the first transistor from the metal control gate; and
  a second silicon nitride spacer formed between the second metal gate of the second transistor and the metal control gate to separate the second metal gate of the second transistor from the metal control gate, wherein the silicon nitride cap, the first silicon nitride spacer, and the second silicon nitride spacer are configured to store charge carriers in response to an absence of voltage applied to the first metal gate and the second metal gate.

2. The apparatus of claim 1, further comprising a metal ring configured to isolate the silicon nitride cap and to couple the first metal gate of the first transistor to the second metal gate of the second transistor.

3. The apparatus of claim 1, wherein the 2T field FET MNOS MTP memory is a PMOS device.

4. The apparatus of claim 1, wherein the 2T field FET MNOS MTP memory is an NMOS device.

5. The apparatus of claim 1, further comprising at least one of a mobile device, a base station, a terminal, a set top box, a music player, a video player, an entertainment unit, a navigation device, a communications device, a personal digital assistant (PDA), a fixed location data unit, and a computer, of which the 2T field FET MNOS MTP memory is a constituent part.

6. The apparatus of claim 1, further comprising:
 a first contact terminal formed on a drain diffusion region of the first transistor to couple the drain diffusion region to a source line; and
 a second contact terminal formed on a source diffusion region of the second transistor to couple the source diffusion region to a bit line.

7. The apparatus of claim 1, wherein the first metal gate of the first transistor is electrically coupled to the second metal gate of the second transistor.

* * * * *